(12) United States Patent
Ozawa

(10) Patent No.: US 6,870,668 B2
(45) Date of Patent: Mar. 22, 2005

(54) METHOD FOR EVALUATING IMAGE FORMATION PERFORMANCE

(75) Inventor: Toshihiko Ozawa, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/398,524

(22) PCT Filed: Oct. 9, 2001

(86) PCT No.: PCT/JP01/08852

§ 371 (c)(1),
(2), (4) Date: Aug. 19, 2003

(87) PCT Pub. No.: WO02/31570

PCT Pub. Date: Apr. 18, 2002

(65) Prior Publication Data

US 2004/0070744 A1 Apr. 15, 2004

(30) Foreign Application Priority Data

Oct. 10, 2000 (JP) .......................................... 2000-309475
Feb. 8, 2001 (JP) .......................................... 2001-32119

(51) Int. Cl.$^7$ .............................. G02B 9/00; G02B 5/30
(52) U.S. Cl. ........................ 359/352; 359/754; 359/497; 359/499
(58) Field of Search .............................. 355/71, 67, 53, 355/55; 359/726, 754, 497, 499, 494, 352, 332

(56) References Cited

U.S. PATENT DOCUMENTS

| 5,898,501 | A | 4/1999 | Suzuki et al. |
| 6,137,626 | A | 10/2000 | Takaoka |
| 6,201,634 | B1 | 3/2001 | Sakuma et al. |
| 6,252,712 | B1 | 6/2001 | Fürter et al. |
| 6,366,404 | B1 | 4/2002 | Hiraiwa et al. |
| 2002/0191288 | A1 | 12/2002 | Gruner et al. |
| 2003/0000453 | A1 | 1/2003 | Unno et al. |
| 2003/0011893 | A1 | 1/2003 | Shiraishi et al. |
| 2003/0011896 | A1 | 1/2003 | Shiraishi |
| 2003/0012724 | A1 | 1/2003 | Burnett et al. |
| 2003/0021026 | A1 | 1/2003 | Allan et al. |
| 2003/0025894 | A1 | 2/2003 | Owa et al. |
| 2003/0053036 | A1 | 3/2003 | Fujishima et al. |
| 2003/0058421 | A1 | 3/2003 | Omura et al. |
| 2003/0086071 | A1 | 5/2003 | McGuire, Jr. |
| 2003/0086156 | A1 | 5/2003 | McGuire, Jr. |

(List continued on next page.)

FOREIGN PATENT DOCUMENTS

| EP | 1 114 802 A1 | 7/2001 |
| JP | A 7-283119 | 10/1995 |
| JP | A 10-154657 | 6/1998 |

(List continued on next page.)

OTHER PUBLICATIONS

Burnett, John et al., "Intrinsic Birefringence in 157 nm Materials", National Institute of Standards and Technology, Gaithersburg, Maryland.

Nattermann, Kurt et al., "Birefringence of $CaF_2$", Mainz, Germany.

Burnett, John et al., "Intrinsic birefringence in calcium fluoride and barium fluoride", Physical Review B, vol. 64.

Primary Examiner—Peter B. Kim
(74) Attorney, Agent, or Firm—Oliff & Berridge, PLC

(57) ABSTRACT

The present invention accomplishes an evaluation of image formation performance in which the influence of a coat is accurately reflected. According to the present invention, for the evaluation of image formation performance of an optical system obtained is a pupil transmittance distribution (a distribution of light transmittance on an exit pupil surface) of a light beam that enters an image point to be evaluated of the optical system. At least one of a rotational symmetrical component, an odd symmetrical component, and an even symmetrical component is extracted from the obtained pupil transmittance distribution as an evaluation index.

80 Claims, 10 Drawing Sheets

U.S. PATENT DOCUMENTS

| | | |
|---|---|---|
| 2003/0086157 A1 | 5/2003 | McGuire, Jr. |
| 2003/0086171 A1 | 5/2003 | McGuire |
| 2003/0099047 A1 | 5/2003 | Hoffman et al. |
| 2003/0137733 A1 | 7/2003 | Gerhard et al. |
| 2004/0105170 A1 | 6/2004 | Krahmer et al. |

FOREIGN PATENT DOCUMENTS

| | | |
|---|---|---|
| JP | A 10-284368 | 10/1998 |
| JP | A 11-54411 | 2/1999 |
| JP | A 8-107060 | 2/1999 |
| JP | 11-054411 | 2/1999 |
| JP | A 2000-47103 | 2/2000 |
| JP | A 2000-121491 | 4/2000 |
| JP | A 2000-331927 | 11/2000 |
| JP | A 2002-139663 | 5/2002 |
| WO | WO00/67303 | 9/2000 |
| WO | WO 02/093209 A2 | 11/2002 |
| WO | WO 02/093257 A2 | 11/2002 |
| WO | WO 03/009021 A1 | 1/2003 |
| WO | WO 03/009062 A1 | 1/2003 |

Fig. 6

| EXAMPLE | CORRECTION TARGET | EVALUATION INDEX | OPTIMIZATION PARAMETERS |
|---|---|---|---|
| 1 | DESIRED WAVEFRONT ABERRATION $WA^{(t)}$ | OVERALL WAVEFRONT ABERRATION WA | LENS PARAMETERS AND COAT PARAMETERS |
| 2 | DESIRED WAVEFRONT ABERRATION $WA^{(t)}$ | (WAVEFRONT ABERRATION WITH ONLY LENS) + (WAVEFRONT ABERRATION WITH ONLY COAT (INITIAL VALUE)) <br><br> WACconst + WAL | LENS PARAMETERS AND COAT PARAMETERS |
| 3 | DESIRED WAVEFRONT ABERRATION $WA^{(t)}$ | (WAVEFRONT ABERRATION WITH ONLY LENS) + ((OVERALL WAVEFRONT ABERRATION (INITIAL VALUE)) − (WAVEFRONT ABERRATION WITH ONLY LENS (INITIAL VALUE))) <br><br> WAL + (WACconst − WALconst) | LENS PARAMETERS AND COAT PARAMETERS |
| 4 | OVERALL WAVEFRONT ABERRATION (INITIAL VALUE) WAconst | WAVEFRONT ABERRATION WITH ONLY LENS WAL | LENS PARAMETERS AND COAT PARAMETERS |

( IN EXAMPLE 4, SIGN INVERSION IS REQUIRED.)

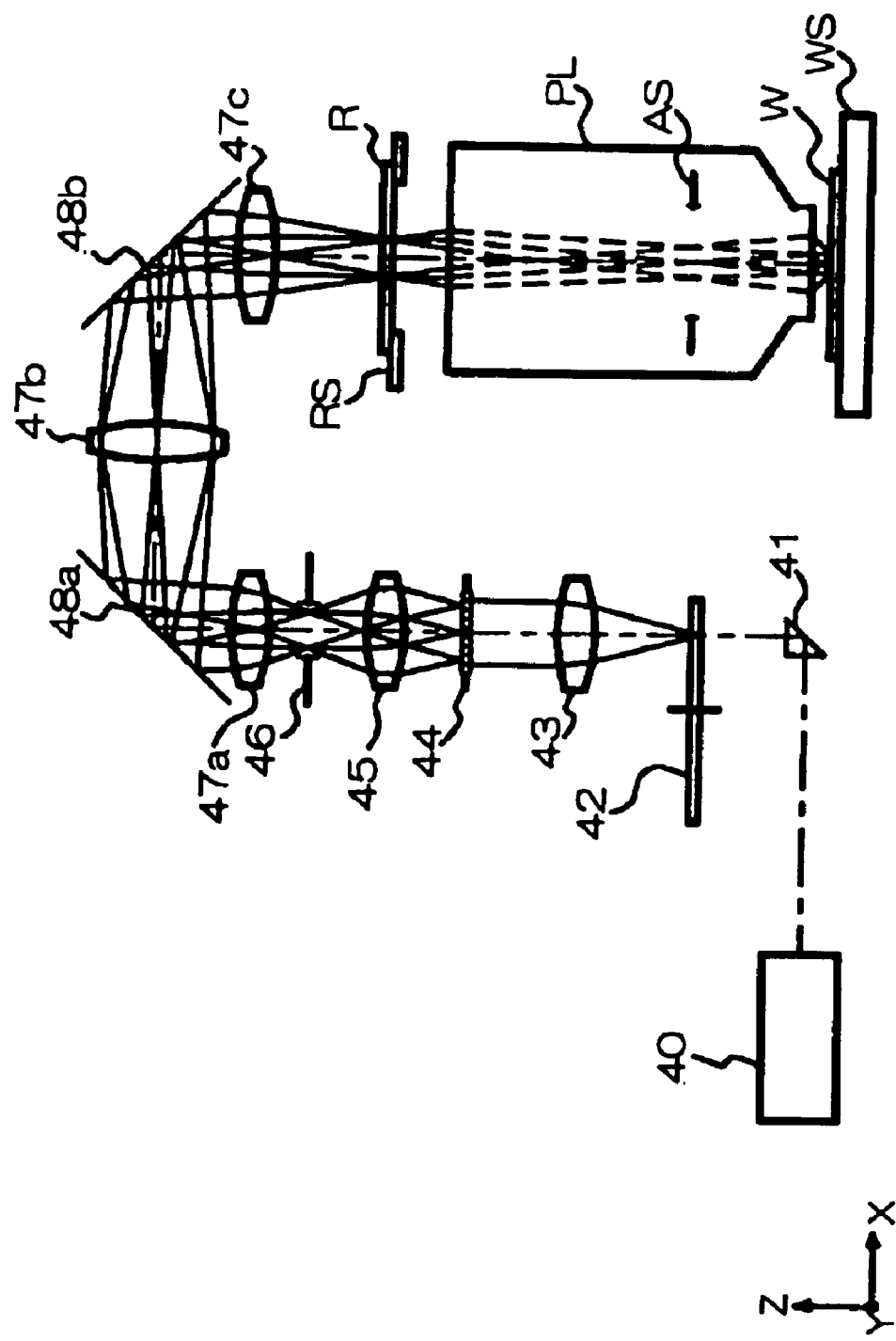

METHOD FOR EVALUATING IMAGE FORMATION PERFORMANCE

BACKGROUND OF THE INVENTION

1. Field of the Invention

The present invention relates to an evaluating method for image formation performance of optical systems such as a projection optical system and an observation optical system used in photolithography, a coat designing method according to the evaluation, an optical system designing method according to the evaluation, an optical system, an optical system manufacturing method, a design program, a computer readable storage medium, a projection exposure apparatus, and a projection exposure method.

In addition, the present invention relates to a projection optical system, a manufacturing method thereof, and an exposure apparatus having the projection optical system, in particular, to a projection optical system suitable for an exposure apparatus used when microdevices such as a semiconductor device and a liquid crystal display device are manufactured by a photolithography processing.

2. Description of the Related Art

When a fine pattern of an electronic device (a microdevice) such as a semiconductor integrated circuit or a liquid crystal display is formed, in a known photolithography method, a pattern to be formed is proportionally enlarged around four to five times and drawn on a photo mask (also called a reticle). The pattern on the photo mask is reduced, exposed, and transferred onto a photosensitive substrate (target exposure substrate) such as a wafer using a projection exposure apparatus.

when an optical system such as a projection optical system used in the photolithography is designed, since the number of combinations of surface shapes, surface intervals, clear apertures, reflectivities, refractivities, tolerances, and so forth of lenses, mirrors, and so forth that compose the optical system is huge. Thus, a design solution that satisfies a request spec cannot be definitely obtained.

Thus, to obtain final data, image formation performance of the optical system is evaluated according to basic data by numeric calculations for tracing light rays and the like, and correction of the basic data is repetitively done until the image formation performance falls within the target range (hereinafter, a design for surface shapes, surface intervals, clear apertures, reflectivities, refractivities, tolerances, and so forth of optical elements that compose an optical system is referred to as "optical design").

Note that calculations necessary for the optical design are automatically performed by a computer because increases in the number of optical devices complex the calculations exponentially.

Generally, coats specific to individual optical elements are formed on the surfaces thereof so as to prevent reflection, restrict transmission light, or increase reflection. The coats have influences on the image formation performance of the optical system, and the influences vary depending on the structures of the coats (for example, the number of layers, the thickness of each layer, the material of each layer, the absorption coefficient of each layer, and so forth). The influences also vary depending on what type of coats are formed on what surfaces of what optical elements.

In particular, the request spec for a projection optical system used in the photolithography is very high, and a large number of optical elements constitute the projection optical system. Therefore, the influence of coats formed on the optical elements is not ignorable. In addition, a reflection type projection optical system and a reflection-refraction type projection optical system have reflection surfaces on which a predetermined function is to be provided. Thus, coats formed on the reflection surfaces need to be multi-layered. Accordingly, the coats largely influence the image formation performance.

Thus, when a projection optical system is designed, in addition to the forgoing optical design, "coat design" and "coat allocation" are performed.

In the coat design, various types of coat data as design solutions such as the number of layers of coats, the thickness of each layer, the material of each layer, and so forth that satisfy a request for reflectivity characteristic (transmittance characteristic) are obtained.

In the coat allocation, with numeric calculations such as ray-tracing according to various coat data and pre-obtained design data of optical elements (final data and basic data), while image formation performance of the projection optical system is being evaluated, to obtain good image formation performance, it is determined that what type of coat data is allocated to what surface.

When the conventional coat allocation is evaluated, a pupil transmittance $T0$ of a light ray that passes through the center of an exit pupil surface and transmittances $T1, T2, T3, \ldots$ of several ten light rays that pass through an edge portion of the exit pupil surface are obtained from a light beam that enters the center of an image through the projection optical system. The degree of deviation of the obtained pupil transmittances $Ti$, for example the difference $\Delta(=Tmax-Tmin)$ between the maximum value $Tmax$ and the minimum value $Tmin$ is referred to as evaluation index. The smaller the evaluation index $\Delta$ is, the better image formation performance it represents.

In the photolithography, to satisfy a request for a fine structure of semiconductor integrated circuits, the exposure light wavelengths are being shifted toward the short wave side.

At present, the main stream of the exposure light wavelengths is 248 nm of a KrF excimer laser. In addition, an ArF excimer laser that has a shorter wavelength of 193 nm is being entered into the practical stage.

Moreover, projection exposure apparatuses that use light sources of a $F_2$ laser having a wavelength of 157 nm, a $Kr_2$ laser having a wavelength of 146 nm, an $Ar_2$ laser having a wave length of 126 nm, and so forth that supply light of a wavelength band that is so-called vacuum ultraviolet region have been proposed.

Furthermore, when the numerical aperture (NA) of a projection optical system becomes large, a high resolution can be accomplished. Thus, in addition to efforts for shortening the exposure light wavelengths, projection optical systems having larger numerical apertures have been developed.

Materials (lens materials) that have good transmittances and uniformity to ultraviolet exposure light having such a short wavelength are restricted.

In a projection optical system that uses an ArF excimer laser as a light source, synthesized silica as a lens material can be used. However, since the chromatic aberration cannot be sufficiently compensated with one kind of lens material, calcium fluoride crystal (fluorite) is used in some lenses.

On the other hand, in a projection optical system that uses an $F_2$ laser as a light source, a lens material that can be used is substantially restricted to calcium fluoride crystal (fluorite).

However, the higher the resolution currently required for the photolithography, the higher the request spec for a projection optical system PL. Thus, it becomes necessary to properly suppress the influence of coats on the image formation performance.

To do that, in addition to the coat allocation according to the evaluated result using the forgoing evaluation index Δ, the coat design and optical design may be performed. In addition, an illumination optical system used in the photolithography may be designed.

However, in any manner, unless the influence of the coats accurately reflects the evaluation, the influence cannot be more properly suppressed.

SUMMARY OF THE INVENTION

In view of solving the above problems, a first object of the present invention is to provide a method for evaluating the image formation performance with the influences of coats accurately reflected therein.

In addition, a second object of the present invention is to provide a coat designing method and an optical system that realize proper elimination of the influences of coats.

A third object of the present invention is to properly eliminate the influences of coats and to thereby secure excellent image formation performance.

Note that a recent report has shown that calcium fluoride (fluorite) crystal as a cubic system has an intrinsic birefringence to an ultraviolet ray with a short wavelength. The aberration occurring due to birefringence of a lens material is critically defective to an optical system with ultra high accuracy such as a projection optical system used to manufacture an electronic device. Thus, it is essential to adopt a lens structure and lens design with substantially no influence from the birefringence.

A fourth object of the present invention is therefore to provide a method for evaluating image formation performance with the influences from the birefringence accurately reflected therein, even if a crystal material such as fluorite having intrinsic birefringence is used.

In addition, a fifth object of the present invention is to provide an optical system designing method that realizes proper elimination of influences from the birefringence.

Moreover, a sixth object of the present invention is to properly eliminate the influences from the birefringence and secure excellent image formation performance.

To accomplish the forgoing objects, a method for evaluating image formation performance of an optical system according to the present invention is characterized by having the steps of obtaining a pupil transmittance distribution (in the Specification "pupil transmittance distribution" refers to "a distribution of light transmittance on an exit pupil surface") of a light beam that enters an image point to be evaluated of the optical system; and extracting as evaluation indexes at least one of a rotational symmetrical component, an odd symmetrical component, and an even symmetrical component from the obtained pupil transmittance distribution.

Coats formed on the surfaces of optical elements such as lenses and mirrors have influences on incident light rays into these surfaces. One of the influences is a decrease in light intensity. The amount of decrease in the light intensity of the rays due to the coats depends on the incident angles of the rays.

In contrast, the forgoing evaluation indexes depend on transmittances (pupil transmittance distribution) of individual light rays that exit at different exit angles and pass through the exit pupil surface at different positions. Therefore, the influence from coats is accurately reflected in the evaluation indexes.

In addition, since those evaluation indexes represent a rotational symmetrical component, an odd symmetrical component, and an even symmetrical component on the exit pupil surface, it is able to independently evaluate the image formation performance, especially, non-uniformity of contrasts due to an image height, asymmetry of pattern image shapes due to focal positions, and non-uniformity of contrasts due to orientations of patterns.

Moreover, in the image formation performance evaluating method it is preferable to obtain a pupil transmittance distribution of a light beam that enters a central image point of the optical system and to set the evaluation indexes for the central image point by representing the pupil transmittance distribution obtained for the image point to be evaluated by a deviation from the pupil transmittance distribution obtained for the central image point. Thus, introducing evaluation indexes that represent differences among the image heights makes it possible to evaluate the image formation performance according to the differences among the image heights.

Moreover, in the image formation performance evaluating method, the image formation performance evaluation should be preferably made for each of a plurality of image points to be evaluated having different image heights. Thus, setting a plurality of image points to be evaluated having different image heights (for example, the maximum image height and the medium image height) allows the evaluation of the image formation performance for every image height.

Furthermore, in the image formation performance evaluating method, the evaluation indexes are preferably extracted using a zernike function (polynominals). The expansion of the zernike function, as described in "Principles of Optics II", written by Max Born and Emil Wolf, published by Tokai University Syuppan-Kai, is applied in general when the wavefront aberration of an optical system is divided into individual aberration components. Various characteristics intrinsic to the optical system are taken into consideration in very detail therein. Accordingly, each of the above evaluation indexes is accurately extracted. Using the zernike function is also advantageous that operations (such as function fitting and so forth) for the expansion are relatively easily performed because they are conventionally used in general.

The image formation performance evaluating method of the present invention is characterized in that it has the steps, for evaluation of image formation performance of the optical system, of obtaining a phase shift distribution in a first polarization direction of a light beam on an exit pupil surface of the optical system and a phase shift distribution in a second polarization direction of the light beam, the light beam entering an image point to be evaluated of the optical system, the second polarization direction being orthogonal to the first polarization direction; and obtaining as an evaluation index an average phase shift distribution that is obtained from the sum of the phase shift distribution in the first polarization direction and the phase shift distribution in the second polarization direction.

Coats formed on the surfaces of optical elements such as lenses and mirrors have influences on incident light rays into these surfaces. One of the influences is a phase shift. The amount of the phase shift of the rays due to the coats depends on the incident angles of the rays. In contrast, the forgoing evaluation index depends on phase shifts (phase shift distribution) of individual light rays that exit at different exit angles and pass through the exit pupil surface at different positions. Therefore, the influence from coats is properly reflected in the evaluation indexes.

In addition, since the evaluation index represents an average of phase shift distributions in two directions that are orthogonal to each other, and the phase shift distributions correspond to the wavefront aberration of the optical system, it is possible to evaluate the image formation performance according to the wavefront aberration.

It is further preferable that the image formation performance evaluating method of the present invention comprises the steps of obtaining an average phase shift distribution of a light beam that enters a central image point of the optical system; and representing the average phase shift distribution obtained for the image point to be evaluated by a deviation from the average phase shift distribution obtained for the central image point so as to set the evaluation index for the central image point. This makes it possible to evaluate the image formation performance from the differences of the image heights using evaluation indexes that represent differences among the image heights.

Moreover, in this method, it is preferred that the image formation performance should be evaluated for each of a plurality of image points to be evaluated that have different image heights from each other. Thus, setting a plurality of image points to be evaluated having different image heights (for example, the maximum image height and the medium image height) makes it possible to evaluate the image formation performance for every image height.

More preferably, a wavefront aberration of the optical system is evaluated by applying a zernike function to the obtained evaluation index.

As described above, the expansion of the zernike function is applied to the division of the wavefront aberration of an optical system into individual aberration components. The expansion of the zernike function is made with each characteristic intrinsic to the optical system taken into account in very detail; therefore, each aberration component is accurately evaluated by using each evaluation index. Using the zernike function is also advantageous that operations (such as function fitting and so forth) necessary for the expansion are relatively easily performed because they are conventionally used in general.

The image formation performance evaluating method of the present invention is characterized by comprising the steps of obtaining a phase shift distribution in a first polarization direction of a light beam on an exit pupil surface of the optical system, and a phase shift distribution in a second polarization direction of the light beam, the light beam entering an image point to be evaluated of the optical system, the second polarization direction being orthogonal to the first polarization direction; and obtaining as an evaluation index a retardation distribution that is obtained from a difference between the phase shift distributions in the first and second polarization directions.

Coats formed on surfaces of optical elements such as lenses and mirrors have influences on incident light rays into these surfaces. One of the influences is a phase shift. The amount of the phase shift of the rays due to the coats depends on the incident angles of the rays. In contrast, the forgoing evaluation index depends on phase shifts (phase shift distribution) of individual light rays that exit at different exit angles and pass through the exit pupil surface at different positions. Therefore, the influence from coats is properly reflected in the evaluation indexes. Besides, the evaluation index represents a retardation distribution so that the image formation performance can be evaluated according to the contrast of the image.

Moreover, the image formation performance evaluating method preferably comprises the steps of obtaining a retardation distribution of a light beam that enters a central image point of the optical system; and representing the retardation distribution obtained for the image point to be evaluated by a deviation from the retardation distribution obtained for the central image point so as to set the evaluation index for the central image point. Thus, using an evaluation index that represents differences of the image heights allows the image formation performance to be evaluated according to the differences of the image heights.

In the image formation performance evaluating method, it is preferred that the image formation performance should be evaluated for each of a plurality of image points to be evaluated having different image heights. Setting a plurality of image points to be evaluated having different image heights (for example, the maximum image height and the medium image height) makes it possible to evaluate the image formation for each image height.

It is further preferable that the image point to be evaluated should be a central image point of the optical system, and that an RMS value of the retardation distribution and an average of the retardation distribution on the exit pupil surface should be obtained as evaluation indexes. In this case, the maximum value of the point spread is expressed by those evaluation indexes. Thus, with those evaluation indexes, the image formation performance can be evaluated according to characteristics of the point spread. Also, in the image formation performance evaluating method, the optical system should preferably have an optical element with a coat formed on its front surface.

A coat designing method of the present invention comprises the steps of evaluating image formation performance of an optical system having an optical element with a coat formed on its front surface, by the forgoing image formation performance evaluating method; and designing a coat to be formed on the optical system according to the result of the evaluation step. Evaluating the image formation performance at the coat design by the evaluating method of the present invention makes it possible to design the coat such that the influences from the coat are properly eliminated.

Further, an optical system designing method of the present invention comprises the steps of evaluating image formation performance of an optical system having an optical element with a coat formed on its front surface, on the assumption that the coat is to be an ideal coat; evaluating image formation performance of the optical system by the forgoing image formation performance evaluating method; and designing the optical system according to the results of the two evaluation steps.

Using the evaluating method of the present invention at the optical system design realizes the designing of the optical system with the influences from the coats properly eliminated.

Further, the optical system of the present invention has a coat designed by the forgoing coat designing method. The optical system of the present invention is also designed by the forgoing optical system designing method. The optical systems have good image formation performance because the influences from the coats are properly eliminated as described above.

Moreover, in the above image formation performance evaluating method, the optical system preferably has an optical element having retardation.

The optical system designing method of the present invention further comprises the steps of evaluating image formation performance of an optical system having an optical element having retardation, by the forgoing image formation performance evaluating method; and designing the optical system according to the result of the evaluation step. In addition, the optical system the present invention is designed by the forgoing optical system designing method.

The optical system of the present invention has an optical element with a coat formed on its front surface, wherein: the relation $t_0 \leq 0.04$ is satisfied, where $t_0$ represents an RMS value of a pupil transmittance distribution of a light beam that enters a central image point of the optical system; and the transmittance is a ratio of which the full transmission is 1.

In this case, it is able to control with sufficient accuracy the width and shape of a transferred pattern by the photolithography using the optical system. Note that if the threshold value of the above relation is set to 0.02, they can be controlled with more sufficient accuracy.

In this optical system, it is preferable that the relation $\Delta t \leq 0.032$ should be satisfied, where $\Delta t$ represents an RMS value of the difference between a pupil transmittance distribution of a light beam that enters an image point at a predetermined height of the optical system and a pupil transmittance distribution of a light beam that enters the central image point of the optical system. Here, the transmittance is a ratio of which the full transmission is 1.

In this case, the width and shape of a transferred pattern by the photolithography using the optical system can be unchanged regardless of the imaging position. If the threshold value of the forgoing relation is set to 0.016, the width and shape is more properly maintained.

Moreover, in the optical system, it is preferred that the relation $\Delta t_{rot} \leq 0.02$ should be satisfied, where $\Delta t_{rot}$ represents an RMS value of a rotational symmetrical component extracted from a difference between the pupil transmittance distribution of the light beam that enters the image point at the predetermined image height of the optical system and the pupil transmittance distribution of the light beam that enters the central image point of the optical system. The transmittance here is a ratio of which the full transmission is 1.

In this case, it is possible to reduce differences due to the image heights in widths of transferred patterns by the photolithography using the optical system. Setting the forgoing threshold value to 0.01 can further reduce the differences.

Moreover, in the optical system, it is preferred that the relation $\Delta t_{odd} \leq 0.024$ should be satisfied, where $\Delta t_{odd}$ represents an RMS value of an odd symmetrical component extracted from a difference between the pupil transmittance distribution of the light beam that enters the image point at the predetermined image height of the optical system and the pupil transmittance distribution of the light beam that enters the central image point of the optical system, wherein the transmittance is a ratio of which the full transmission is 1.

In this case, it is possible to suppress changes due to defocusing in shapes of transferred patterns by the photolithography using the optical system. Setting the forgoing threshold value to 0.012 can suppress the changes in the widths more properly.

Moreover, in the optical system, it is preferred that the relation $\Delta t_{evn} \leq 0.032$ should be satisfied, where $\Delta t_{evn}$ represents an RMS value of an odd symmetrical component extracted from a difference between the pupil transmittance distribution of the light beam that enters the image point at the predetermined image height of the optical system and the pupil transmittance distribution of the light beam that enters the central image point of the optical system. The transmittance is a ratio of which full transmission is 1.

In this case, it is possible to suppress changes in widths of transferred patterns in their alignment direction when the patterns are transferred by the photolithography using the optical system. Setting the forgoing threshold value to 0.016 can suppress the changes in the widths more properly.

The optical system of the present invention has an optical element having a coat formed on its front surface, wherein the relation $1-(4\pi^2 \cdot \delta w0^2 + 2\pi^2 \cdot A[\delta W0]^2)/2 \geq 0.98$ is satisfied, where $\delta w0$ represents an RMS value of a retardation distribution that is obtained from a difference between a phase shift distribution in a first polarization direction of a light beam on an exit pupil surface and a phase shift distribution in a second polarization direction of the light beam, the light beam entering a central image point of the optical system, the second polarization direction being orthogonal to the first polarization direction; and $A[\delta0]$ represents an average of the retardation distribution on the exit pupil surface. Here, it is possible to suppress deterioration in the point spread by the photolithography using the optical system Furthermore, according to the present invention a method for evaluating image formation performance of an optical system that has an optical element having retardation, comprises the steps of obtaining a first-1 component that is a component in a first polarization direction of a light beam that exits from an exit pupil surface of the optical system when the light beam having the first polarization direction enters an incident pupil surface of the optical system; obtaining a second-2 component that is a component in a second polarization direction of a light beam that exits from an exit pupil surface of the optical system when the light beam having the second polarization direction that is orthogonal to the first polarization direction enters the incident pupil surface of the optical system; obtaining a first-2 component that is a component in the second polarization direction of the light beam that exits from the exit pupil surface of the optical system when the light beam having the first polarization direction enters the incident pupil surface of the optical system; obtaining a second-1 component that is a component in the first polarization direction of the light beam that exits from the exit pupil surface of the optical system when the light beam having the second polarization direction enters the incident pupil surface of the optical system; and obtaining an amplitude distribution or an intensity distribution of the first-2 component of the light beam and an amplitude distribution or an intensity distribution of the second-1 component of the light beam as evaluation indexes.

In the image formation performance evaluating method, it is preferable that the first-1 and the second-2 components of the light beam are evaluated by the forgoing evaluating method. It is also preferable that the evaluation indexes are extracted using a zernike function. It is further preferable that the optical system should have an optical element with a coat formed on its front surface, and that influences from the coat should be taken into account at the time of obtaining the first-1 component and the second-2 component.

Furthermore, the optical system designing method of the present invention comprises the steps of evaluating image formation performance of an optical system that has an optical element having retardation, by the forgoing image formation performance evaluating method; and designing the optical system according to the result of the evaluation step. In the optical system designing method, it is preferable that a parameter of the optical system should be optimized according to the evaluation indexes. In the optical system designing method, it is also preferable that the optical system should be designed so that intensities of the first-2 and second-1 components of the light beam are to be $1/100$ of or smaller than intensities of the first-1 and second-2 components of the light beam. In addition, the optical system of the present invention is designed by the forgoing optical system designing method.

Furthermore, an optical system manufacturing method of the present invention comprises the step of evaluating image formation performance of an optical system that has an optical element having retardation, by the forgoing image formation performance evaluating method. In addition, the optical system of the present invention is manufactured by the forgoing optical system manufacturing method.

Further, the optical system of the present invention has an optical element having retardation, wherein: when a light beam having a first polarization direction enters an incident pupil surface of the optical system and exits from an exit pupil surface thereof, a component in the first polarization direction of the exiting light beam is defined as a first-1 component; when a light beam having a second polarization direction being orthogonal to the first polarization direction enters the incident pupil surface of the optical system and exits from the exit pupil surface thereof, a component in the second polarization direction of the exiting light beam is defined as a second-2 component; when a light beam having the second polarization direction enters the incident pupil surface of the optical system and exits from the exit pupil surface thereof, a component in the second polarization direction of the exiting light beam is defined as a first-2 component; when a light beam having the second polarization direction enters the incident pupil surface of the optical system and exits from the exit pupil surface thereof, a component in the first polarization direction of the exiting light beam is defined as a second-2 component; and intensities of the first-2 component and the second-1 component of the light beam are $1/100$ of or smaller than intensities of the first-1 component and the second-2 component of the light beam.

Moreover, a design program of the present invention stores therein the steps of evaluating image formation performance of an optical system having an optical element with a coat formed on its front surface, by the forgoing image formation performance evaluating method; and designing a coat to be formed on the optical system according to the result of the evaluation step.

A design program of the present invention stores therein the steps of evaluating image formation performance of an optical system having an optical element with a coat formed on its front surface, on the assumption that the coat is to be an ideal coat; evaluating the image formation performance of the optical system by the forgoing image formation performance evaluating method; and designing the optical system according to the results of the two evaluation steps.

In addition, a design program of the present invention stores therein the steps of evaluating image formation performance of an optical system by the forgoing image formation performance evaluating method; and designing the optical system according to the result of the evaluation step.

Further, a design program of the present invention stores therein the forgoing optical system designing method.

A computer readable storage medium of the present invention stores thereon the forgoing design program.

A projection exposure apparatus of the present invention projection-exposes an image of a projection original to a workpiece with a light beam having a predetermined wavelength, the projection original being disposed on a first surface, the workpiece being disposed on a second surface. The projection exposure apparatus comprises a light source for supplying the light beam having the predetermined wavelength; an illumination optical system being disposed in an optical path between the light source and the first surface, for guiding the light beam from the light source to the projection original; and a projection optical system being disposed in an optical path between the first surface and the second surface, for forming the image of the projection original onto the second surface, wherein the projection optical system is the forgoing optical system.

Furthermore, a projection exposure method of the present invention is for projection-exposing an image of a projection original to a workpiece with a light beam having a predetermined wavelength, the projection original being disposed on a first surface, the workpiece being disposed on a second surface. The method comprises the steps of supplying the light beam having the predetermined wavelength; illuminating the projection original with the light beam having the predetermined wavelength; and causing a projection optical system to form the image of the projection original onto the second surface with the light beam from the projection original, wherein the projection optical system is the forgoing optical system.

BRIEF DESCRIPTION OF DRAWINGS

FIG. 6 is a table showing correction targets, evaluation indexes, and optimization parameters of lens designs (lens corrections) of example 1 to example 4 according to a third embodiment.

FIG. 10 is a schematic diagram showing an outline of an exposure apparatus according to a seventh embodiment.

DESCRIPTION OF THE PREFERRED EMBODIMENTS

[First Embodiment]

First of all, with reference to FIG. 1, FIG. 2, FIG. 3, and FIG. 4, a first embodiment of the present invention will be described.

According to the first embodiment, image formation performance of an optical system is evaluated using two main evaluation indexes (an evaluation index according to a transmittance and an evaluation index according to a phase shift).

In addition, the first embodiment is suitable for evaluating a projection optical system applied to an exposure apparatus. Thus, the following description is to be made on the assumption that the projection optical system is the evaluation object. Since a projection optical system has many optical elements such as lenses and reflection surfaces, calculations required for the evaluation are often complex. Thus, the procedure for obtaining each evaluation index that will be described in the following is assumed to be executed by a computer.

In the Specification, "average" and "RMS" are defined as follows.

An average $F_{ave}$ in an area P of a physical amount F (x, y) that is expressed by a continuous function is given as below:

$$F_{ave} = \int_P F(x,y) dxdy \bigg/ \int_P dxdy$$

The RMS in the area P of the physical amount F (x, y) is given as below:

$$RMS = \left[ \int_P (F(x,y) - F_{ave})^2 dxdy \bigg/ \int_P dxdy \right]^{1/2}$$

In addition, an average $F_{ave}$ and an RMS of integration type discrete data $F_i$ (where i=1, 2, ..., N) according to the continuous function are defined as follows:

$$RMS = \left[ \sum_{i=1}^{n} (F_i - F_{ave})^2 / N \right]^{1/2}$$

$$F_{ave} = \sum_{i=1}^{N} Fi/N$$

<Evaluation Index According to Transmittance>

Figure 1:
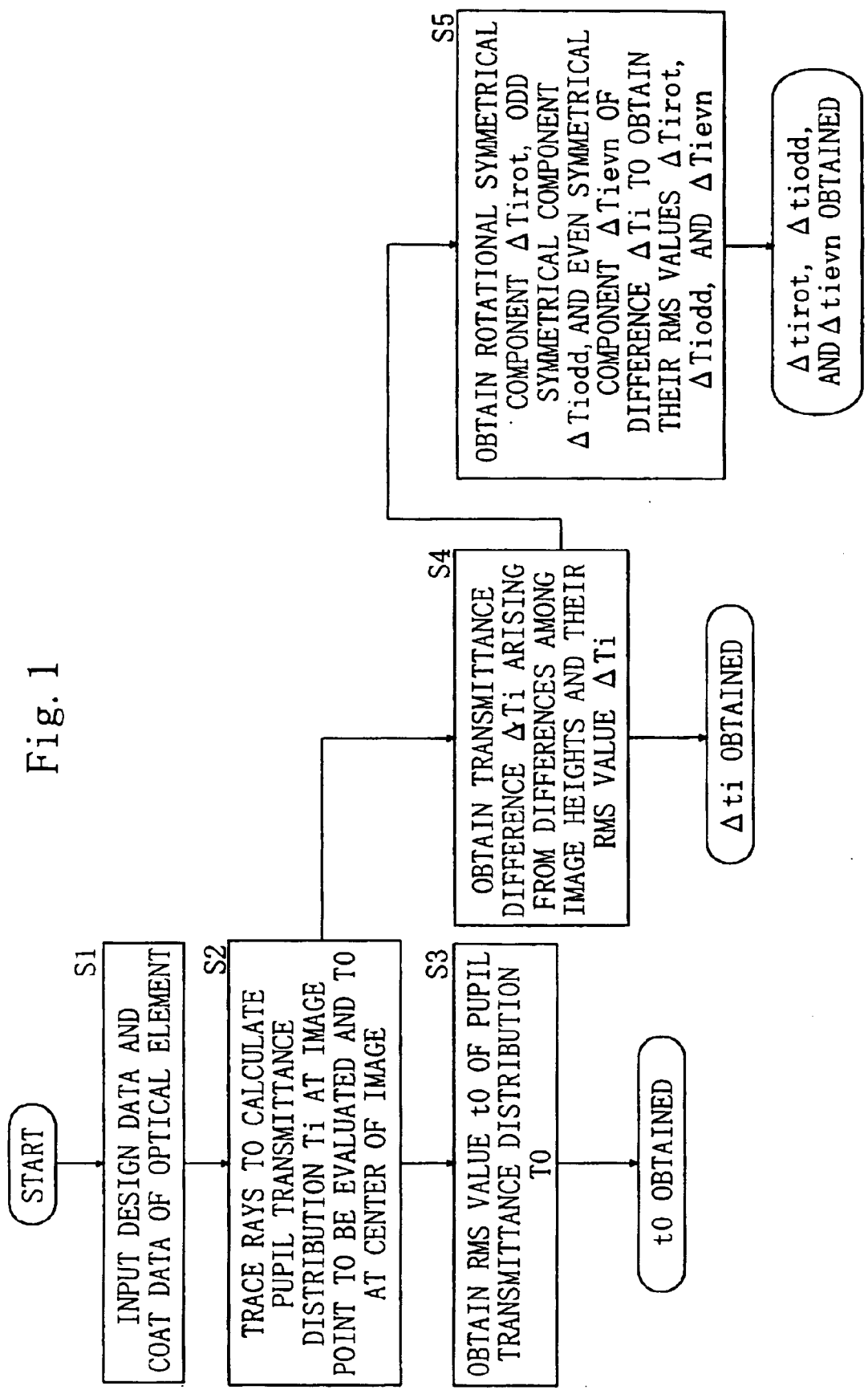
FIG. 1 is a flow chart showing a procedure for obtaining each evaluation index corresponding to a transmittance according to a first embodiment.
Figure 2:
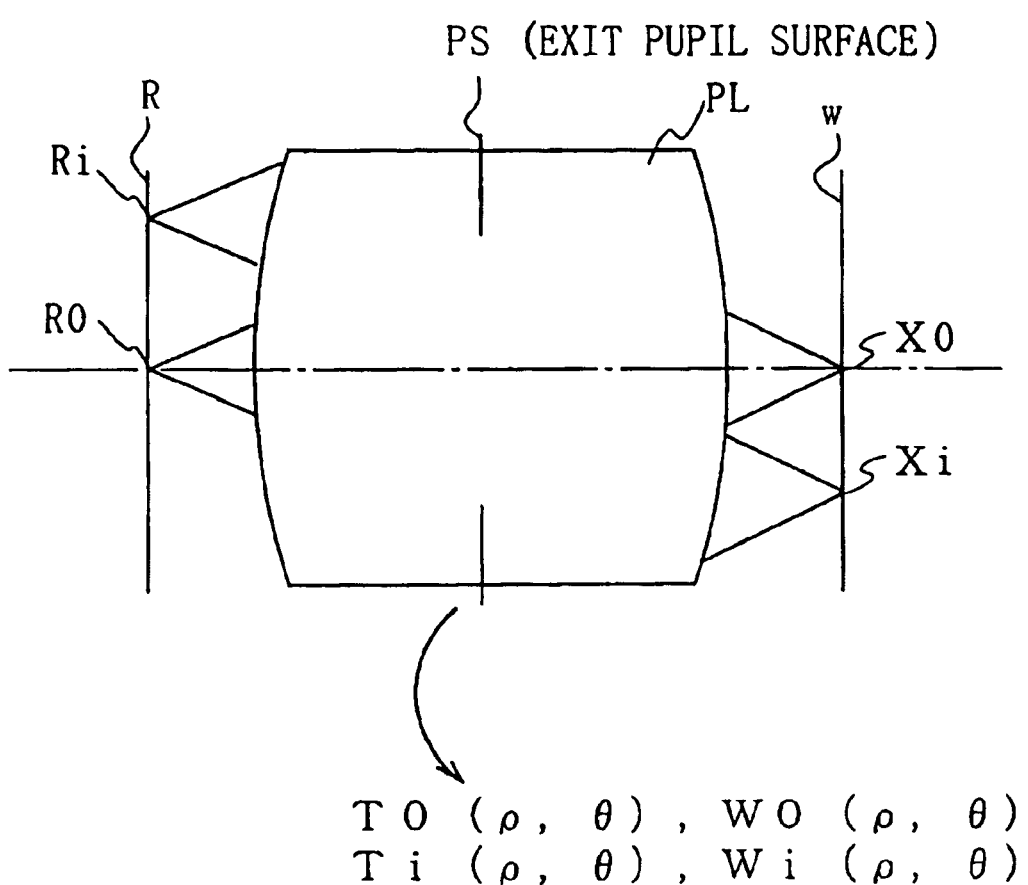
FIG. 2 is a schematic diagram describing a procedure for obtaining each evaluation index according to a transmittance in the first embodiment.

FIG. 1 is a flow chart showing a procedure for obtaining each evaluation index according to a transmittance. FIG. 2 is a schematic diagram for describing the procedure (and another procedure shown in FIG. 3).

(Step 1)

First of all, design data and coat data for optical elements of a projection optical system PL are input to a computer.

In this example, the design data is surface shapes, clear apertures (outer diameters), surface intervals, reflectivities, refractivities, tolerances, and so forth of optical elements such as lenses and reflection surfaces that compose the projection optical system PL.

The coat data is the structures of coats formed on each lens and each reflection surface—namely, the number of layers of coats, thickness of each layer, material of each layer (when necessary, absorption coefficient of each layer), and so forth.

Note that those pieces of data are required to trace light rays that enter from an object side (reticle surface, R side) of the projection optical system PL and obtain the difference between the intensity of each light ray on the object side (wafer surface, W side) and the intensity of each light ray on the image side.

(Step S2)

Next, the computer traces light rays and calculates a pupil transmittance distribution Ti (ρ, θ) of a light beam that enters an image point to be evaluated Xi of any image height (for example, the maximum image height) and a pupil transmittance distribution T0 (ρ, θ) of a light beam that enters the center of an image X0.

According to the first embodiment, when those pupil transmittance distributions are calculated, transmittances for not only an edge portion of the exit pupil surface PS of the projection optical system PL, but all the area of the exit pupil surface PS should be obtained.

Thus, as shown in FIG. 2, when rays of the light beam that enter the image point to be evaluated Xi are traced, rays of the light beam Lfi that exit from a conjugate point Ri of Xi, exit at different exit angles, and that pass through different positions on the exit pupil surface PS are traced (the maximum exit angle of the rays to be traced depends on the image side numerical aperture of the projection optical system PL).

By tracing the light rays, the difference between the intensity of each ray on the object side (wafer surface, W side) of the projection optical system PL and the intensity of the ray on the image side is obtained. With the difference, the pupil transmittance of each ray is obtained.

In this case, the distribution of the pupil transmittances on the exit pupil surface PS is represented in polar coordinates (ρ, θ) as a pupil transmittance distribution Ti (ρ, θ) of a light beam that enter an image point to be evaluated Xi where ρ represents a normalized pupil radius of which the radius of the exit pupil surface PS is normalized to 1 and θ represents a radius vector angle of polar coordinates of which the center of the exit pupil surface PS is the origin.

In addition, when rays of a light beam that enter the center of the image X0 are traced, rays of a light beam Lf0 that exits from a conjugate point R0 of X0 at different exit angles and pass through different positions on the exit pupil surface PS are traced. As a result, the pupil transmittance of each light ray is obtained. The distribution of the pupil transmittances on the exit pupil surface PS is represented in polar coordinates (ρ, θ) as a pupil transmittance distribution T0 (ρ, θ) of a light beam that enter the center of the image X0.

(Step 3)

Next, the computer performs a function fitting for the pupil transmittance distribution T0 (ρ, θ) so as to expand it into a zernike polynomial (zernike expansion) as expressed by Formula (1). In this case, an RMS value (Root Mean Square) t0 of all components except constant terms is obtained as an evaluation index according to a transmittance (t0 has been obtained).

$$T0(\rho, \theta) = \Sigma B_n Z_n (\rho, \theta) \quad (1)$$

where Bn represents an expansion coefficient. Each zernike cylindrical function $Z_n$ (ρ, θ) for each n (where n=1 to 36) can be expressed as follows:

n: $Z_n$ (ρ, θ)
1: 1,
2: ρ cos θ,
3: ρ sin θ,
4: $2\rho^2 - 1$,
5: $\rho^2$ cos 2θ,
6: $\rho^2$ sin 2θ,
7: $(3\rho^2 - 2)\rho$ cos θ,
8: $(3\rho^2 - 2)\rho$ sin θ,
9: $6\rho^4 - 6\rho^2 + 1$, 10: $\rho^3 \cos 3\theta$,
11: $\rho^3 \sin 3\theta$,
12: $(4\rho^2-3)\rho^2 \cos 2\theta$,
13: $(4\rho^2-3)\rho^2 \sin 2\theta$,
14: $(10\rho^4-12\rho^2+3)\rho \cos \theta$,
15: $(10\rho^4-12\rho^2+3)\rho \sin \theta$,
16: $20\rho^6-30\rho^4+12\rho^2-1$,
17: $\rho^4 \cos 4\theta$,
18: $\rho^4 \sin 4\theta$,
19: $(5\rho^2-4)\rho^3 \cos 3\theta$,
20: $(5\rho^2-4)\rho^3 \sin 3\theta$,
21: $(15\rho^4-20\rho^2+6)\rho^2 \cos 2\theta$,
22: $(15\rho^4-20\rho^2+6)\rho^2 \sin 2\theta$,
23: $(35\rho^6-60\rho^4+30\rho^2-4)\rho \cos \theta$,
24: $(35\rho^6-60\rho^4+30\rho^2-4)\rho \sin \theta$,
25: $70\rho^8-140\rho^6+90\rho^4-20\rho^2+1$,
26: $\rho^5 \cos 5\theta$,
27: $\rho^5 \sin 5\theta$,
28: $(6\rho^2-5)\rho^4 \cos 4\theta$,
29: $(6\rho^2-5)\rho^4 \sin 4\theta$,
30: $(21\rho^4-30\rho^2+10)\rho^3 \cos 3\theta$,
31: $(21\rho^4-30\rho^2+10)\rho^3 \sin 3\theta$,
32: $(56\rho^6-104\rho^4+60\rho^2-10)\rho^2 \cos 2\theta$,
33: $(56\rho^6-104\rho^4+6\rho^2-10)\rho^2 \sin 2\theta$,
34: $(126\rho^8-280\rho^6+210\rho^4-60\rho^2+5)\rho \cos \theta$,
35: $(126\rho^8-280\rho^6+210\rho^4-60\rho^2+5)\rho \sin \theta$,
36: $252\rho^{10}-630\rho^8+560\rho^6-210\rho^4+30\rho^2-1$, In other words, t0 is an RMS value of $(\Sigma B_n Z_n (\rho, \theta)-B1)$.

It should be noted that the number of orders of the zernike expansion is not limited to 36, but another value for example 16 or greater than 36.

(Step S4)

With reference to ti $(\rho, \theta)$ and T0 $(\rho, \theta)$ obtained at step S2, the computer obtains a pupil transmittance distribution $\Delta$Ti $(\rho, \theta)$ (hereinafter referred to as transmittance difference arising from differences among image heights) at an image point to be evaluated Xi based on the center of the image X0. The pupil transmittance distribution $\Delta$Ti $(\rho, \theta)$ is obtained by Formula (2).

$$\Delta Ti(\rho, \theta)=Ti(\rho, \theta)-T0(\rho, \theta) \quad (2)$$

In other words, the difference $\Delta$Ti $(\rho, \theta)$ of image heights is a distribution of differences of which coordinates Ti $(\rho, \theta)$ match with coordinates T0 $(\rho, \theta)$.

In addition, the computer performs the zernike expansion for the difference $\Delta$ti $(\rho, \theta)$ of image heights as expressed by Formula (3) and obtains an RMS value $\Delta$ti of all components excluding constant terms as an evaluation index according to a transmittance ($\Delta$ti has been obtained).

$$\Delta Ti(\rho, \theta)=\Sigma C_n Z_n(\rho, \theta) \quad (3)$$

where Cn represents an expansion coefficient.

In other words, $\Delta$ti represents an RMS value of $(\Sigma C_n Z_n (\rho, \theta)-C_1)$.

It should be noted that the number of orders of the zernike expansion is not limited to 36, but another value for example 16 or greater than 36.

(Step S5)

In addition, the computer categorizes the difference $\Delta$Ti $(\rho, \theta)$ obtained at step S4 as three groups of a rotational symmetrical component $\Delta Ti_{rot} (\rho, \theta)$, an odd symmetrical component $\Delta Ti_{odd} (\rho, \theta)$, and an even symmetrical component $\Delta Ti_{evn} (\rho, \theta)$. RMS values $\Delta ti_{rot}$, $\Delta ti_{odd}$, and $\Delta ti_{evn}$ of the grouped terms are obtained as evaluation indexes according to a transmittance ($\Delta ti_{rot}$, $\Delta ti_{odd}$, and $\Delta ti_{evn}$ have been obtained).

The rotational symmetrical component $\Delta Ti_{rot} (\rho, \theta)$, the odd symmetrical component $\Delta Ti_{odd} (\rho, \theta)$, and the even symmetrical component $\Delta Ti_{evn} (\rho, \theta)$ are these (a), (b), and (c):

(a) A term that does not contain $\theta$, which does not vary when it is rotated around the origin (center of the exit pupil surface PS).

(b) A term that contains a trigonometric function that is greater odd number times than $\theta$, which does not vary when it is rotated around the origin by 360°/odd number.

(c) A term that contains a trigonometric function that is greater than even number times than $\theta$, which does not vary when it is rotated around the origin by 360°/even number.

Thus, when the number of orders of the zernike expansion is 36:

$\Delta ti_{rot}$ is an RMS value of $(C_4(2\rho^2-1)+C_9(6\rho^4-6\rho^2+1)+C_{16}(20\rho^6-30\rho^4+12\rho^2-1)+C_{25}(70\rho^8-140\rho^6+90\rho^4-20\rho^2+1)+C_{36}(252\rho^{10}-630\rho^8+560\rho^6-210\rho^4+30\rho^2-1))$ $\Delta ti_{odd}$ is an RMS value of $+(C_2(\rho \cos \theta)$ $+C_3(\rho \sin \theta)$ $+C_7 ((3\rho^2-2)\rho \cos \theta)$ $+C_8((3\rho^2-2)\rho \sin \theta)$ $+C_{10}(\rho^3 \cos 3\theta)$ $+C_{11}(\rho^3 \sin 3\theta)$ $+C_{14}((10\rho^4-12\rho^2+3)\rho \cos \theta)$ $+C_{15}((10\rho^4-12\rho^2+3)\rho \sin \theta)$ $+C_{19}((5\rho^2-4)\rho^3 \cos 3\theta)$ $+C_{20}((5\rho^2-4)\rho^3 \sin 3\theta)$ $+C_{23}((35\rho^6-60\rho^4+30\rho^2-4)\rho \cos \theta)$ $+C_{24}((35\rho^6-60\rho^4+30\rho^2-4)\rho \cos \theta)$ $+C_{26}(\rho^5 \cos 5\theta)$ $+C_{27}(\rho^5 \sin 5\theta)$ $+C_{30}((21\rho^4-30\rho^2+10)\rho^3 \cos 3\theta)$ $+C_{31}((21\rho^4-30\rho^2+10)\rho^3 \sin 3\theta)$ $+C_{34}((126\rho^8-280\rho^6+210\rho^4-60\rho^2+5)\rho \cos \theta)$ $+C_{35}((126\rho^8-280\rho^6+210\rho^4-60\rho^2+5)\rho \cos \theta)$ $\Delta ti_{even}$ is an RMS value of $+(C_5(\rho^2 \cos 2\theta)$ $+C_6(\rho^2 \sin 2\theta)$ $+C_{12}((4\rho^2-3)\rho^2 \cos 2\theta)$ $+C_{13}((4\rho^2-3)\rho^2 \sin 2\theta)$ $+C_{17}(\rho^4 \cos 4\theta)$ $+C_{18}(\rho^4 \sin 4\theta)$ $$+C_{21}((15\rho^4-20\rho^2+6)\rho^2 \cos 2\theta)$$

$$+C_{22}((15\rho^4-20\rho^2+6)\rho^2 \sin 2\theta)$$

$$+C_{28}((6\rho^2-5)\rho^4 \cos 4\theta)$$

$$+C_{29}((6\rho^2-5)\rho^4 \sin 4\theta)$$

$$+C_{32}((56\rho^6-104\rho^4+60\rho^2-10)\rho^2 \cos 2\theta)$$

$$+C_{33}((56\rho^6-104\rho^4+60\rho^2-10)\rho^2 \sin 2\theta)$$

It should be noted that the number of orders of the zernike expansion is not limited to 36, but any value such as 16, or greater than 36.

<Evaluation Index According to Phase Shift>

Figure 3:
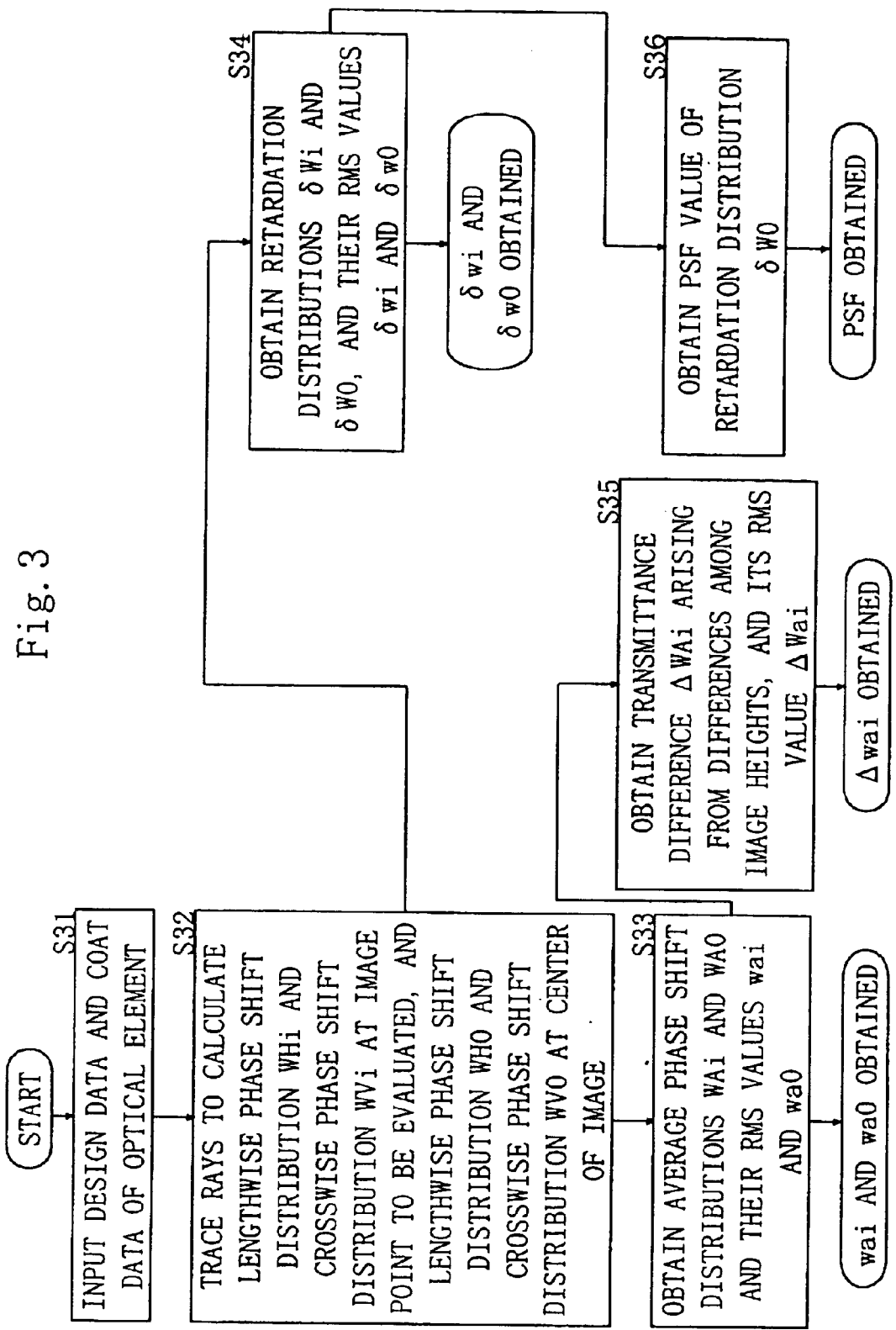
FIG. 3 is a flow chart showing a procedure for obtaining each evaluation index according to a phase shift in the first embodiment.

FIG. 3 is a flow chart showing a procedure for obtaining each evaluation index according to a phase shift.

(Step S31)

First of all, design data and coat data and coat data of optical elements of a projection optical system PL are input to the computer.

These pieces of data are information essential to trace light rays that are entered from the object side (reticle surface, R side) of the projection optical system PL and obtain a complex amplitude of each light ray on the object surface (wafer surface W).

(Step S32)

Next, the computer traces light rays and calculates a lengthwise phase shift distribution WHj ($\rho$, $\theta$) and a crosswise phase shift distribution WVi ($\rho$, $\theta$) of a light beam that enters any image point to be evaluated Xi (for example, the maximum image height) and a lengthwise phase shift distribution WH0 ($\rho$, $\theta$) and a crosswise phase shift distribution WV0 ($\rho$, $\theta$) of a light beam that enters the center of the image X0 (at step S32).

In this example, "lengthwise" and "crosswise" represent two polarization directions that are orthogonal to each other on the exit pupil surface regardless of the traveling direction of light rays.

According to the first embodiment, when the phase shift distributions are calculated, the complex amplitudes are obtained for not only an edge portion of the exit pupil surface PS of the projection optical system PL, but all the exit pupil surface PS.

Thus, as shown in FIG. 2, when rays of a light beam that enters the image point to be evaluated Xi are traced, rays of a light beam Lfi that exit from a conjugate point Ri at Xi at different exit angles and pass through different positions on the exit pupil surface PS are traced (the maximum exit angle of rays to be traced depends on the image side numerical aperture of the projection optical system PL).

By tracing the rays, a complex amplitude distribution in the lengthwise polarization direction and a complex amplitude distribution in the crosswise polarization direction of the light beam Lfi on the exit pupil surface PS are obtained. With those distributions, a lengthwise phase shift distribution and a crosswise phase shift distribution are obtained.

Those distributions are expressed in polar coordinates ($\rho$, $\theta$) on the exit pupil surface PS as the lengthwise phase shift distribution WHi ($\rho$, $\theta$) and the crosswise phase shift distribution WVi ($\rho$, $\theta$) of the light beam that enters the image point to be evaluated Xi where p represents a normalized pupil radius of which the radius of the exit pupil surface PS is normalized to 1 and $\theta$ represents a radius vector angle in polar coordinates of which the center of the exit pupil surface PS is the origin.

When rays of a light beam that enters the center of the image X0 are traced, rays of a light beam Lfi that exit from a conjugate point R0 at Xi at different exit angles and pass through different positions on the exit pupil surface PS are traced. A complex amplitude distribution in the lengthwise polarization direction and a complex amplitude distribution in the crosswise polarization direction of the light beam Lfi are obtained.

Those distributions are expressed in polar coordinates ($\rho$, $\theta$) on the exit pupil surface PS as the lengthwise phase shift distribution WH0 ($\rho$, $\theta$) and the crosswise phase shift distribution WV0 ($\rho$, $\theta$) of the light beam that enters the center of the image X0.

(Step S33)

Next, the computer obtains an average phase shift distribution WAi ($\rho$, $\theta$) at the image point to be evaluated Xi and an average phase shift distribution WA0 ($\rho$, $\theta$) at the center of the image X0 by Formula (4).

$$WAi(\rho, \theta)=(WVi(\rho, \theta)+WHi(\rho, \theta))/2 \quad (4)$$

In other words, the average phase shift distribution WAi ($\rho$, $\theta$) is a distribution of a medium value of which coordinates WVi ($\rho$, $\theta$) match with coordinates WV0 ($\rho$, $\theta$).

RMS values wai and wa0 of the average phase shift distributions WAi ($\rho$, $\theta$) and WA0 ($\rho$, $\theta$) are obtained as evaluation indexes according to a phase shift (wai and wa0 have been obtained).

(Step S34)

With reference to WVi ($\rho$, $\theta$), WHi ($\rho$, $\theta$), WV0 ($\rho$, $\theta$), and WH0 ($\rho$, $\theta$), the computer obtains a retardation distribution $\delta$Wi ($\rho$, $\theta$) at the image point to be evaluated Xi and a retardation distribution $\delta$W0 ($\rho$, $\theta$) at the center of the image X0 by Formula (5).

$$\delta Wi(\rho, \theta)=WVi(\rho, \theta)-WHi(\rho, \theta) \quad (5)$$

In other words, the retardation distribution $\delta$Wi ($\rho$, $\theta$) is a distribution of differences of which coordinates WVi ($\rho$, $\theta$) match with coordinates WV0 ($\rho$, $\theta$).

In addition, RMS values $\delta$wi and $\delta$w0 of the retardation distributions bWi ($\rho$, $\theta$) and $\delta$W0 ($\rho$, $\theta$) are obtained as evaluation indexes according to a phase shift ($\delta$wi and $\delta$w0 have been obtained).

(Step S35)

In addition, with reference to WAi ($\rho$, $\theta$) and WA0 ($\rho$, $\theta$) obtained at step S33, the computer obtains an average phase shift distribution $\Delta$WAi ($\rho$, $\theta$) (which is the transmittance difference arising from differences among image heights) at the image point to be evaluated Xi based on the center of the image X0. The average phase shift distribution $\Delta$WAi ($\rho$, $\theta$) is obtained by Formula (6).

$$\Delta Ai(\rho, \theta)=WAi(\rho, \theta)-WA0(\rho, \theta) \quad (6)$$

In other words, the difference $\Delta$WAi ($\rho$, $\theta$) of image heights is a distribution of the differences of which coordinates WAi ($\rho$, $\theta$) match with WA0 ($\rho$, $\theta$).

An RMS value $\Delta$wai of the obtained difference $\Delta$WAi ($\rho$, $\theta$) is obtained as an evaluation index according to a phase shift ($\Delta$wai has been obtained).

(Step S36)

With reference to the retardation distribution $\delta$W0 obtained at step S34, the computer obtains the RMS value $\delta$w0 and the average value A[$\delta$W0] on the exit pupil surface and obtains a PSF value as an evaluation index according to a phase shift by Formula (7) (PSF has been obtained).

$$PSF=1-(4\pi^2 \cdot \delta w0^2+2\pi^2 \cdot A[\delta W0]^2)/2 \quad (7)$$

According to the first embodiment, in addition to wai, wa0, and wai obtained in the forgoing manner, the following evaluation indexes (a), (b), and (c) may be obtained.

(a) An RMS value of each term obtained by zernike-expanding WAi (ρ, θ) or/and an RMS value of each term obtained by grouping a plurality of terms obtained by zernike-expanding WAi (ρ, θ)

(b) An RMS value of each term obtained by zernike-expanding WA0 (ρ, θ) or/and an RMS value obtained by grouping a plurality of terms obtained by zernike-expanding WA0 (ρ, θ)

(c) An RMS value of each term obtained by zernike-expanding ΔWAi (ρ, θ) or/and an RMS value of each term obtained by grouping a plurality of terms obtained by zernike-expanding ΔWAi (ρ, θ)

<About Each Evaluation Index>

Next, quantities that the individual evaluation indexes t0, Δti, $\Delta ti_{rot}$, $\Delta ti_{odd}$, $\Delta ti_{evn}$, wai, wa0, Δwai, δwi, δw0, and PSF represent, which have been obtained in the forgoing procedure, will be described.

Since "t0" is an RMS value of a pupil transmittance distribution T0 (ρ, θ) at the center of the image X0, "t0" represents a degree of deterioration in a contrast of the projection optical system PL. By the way, when this value is too large, there is a risk of which the width and shape of a transferred pattern cannot be controlled to desired values in the photolithography.

Since "Δti" is an RMS value of a pupil transmittance distribution at the image point to be evaluated Xi based on the center of the image X0, "Δti" represents non-uniformity (unevenness of intensity) of a contrast at an image position. By the way, when this value is too large, there is a risk of which the width and shape of a transferred pattern vary depending on an image position in the photolithography.

Figure 4:
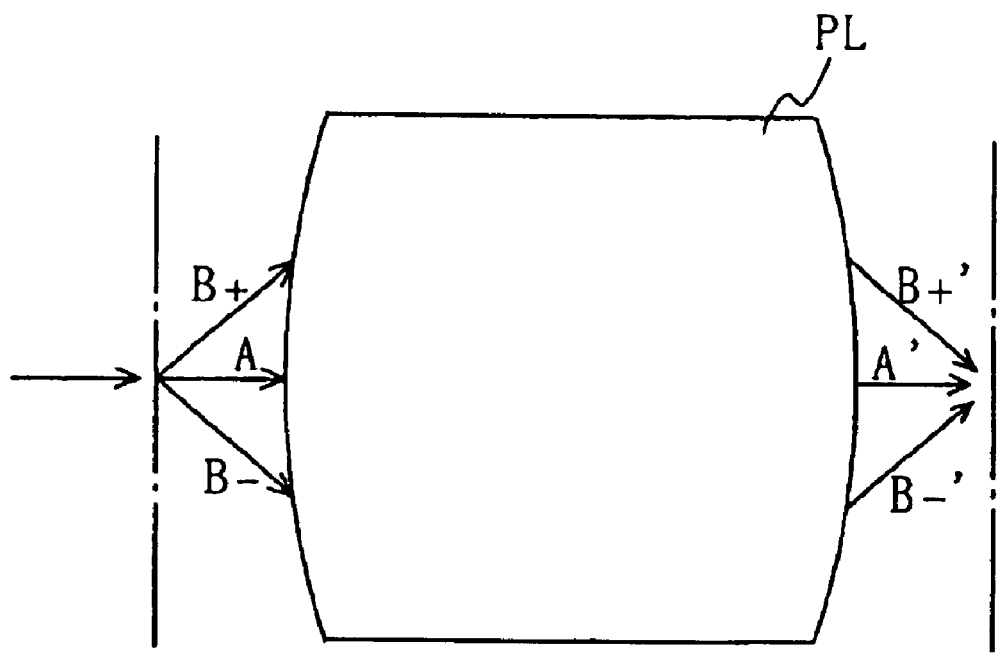
FIG. 4 is a schematic diagram showing a triple-beam interference with single point illumination.

Before $\Delta ti_{rot}$, $\Delta ti_{odd}$, and $\Delta t_{evn}$ are described, for easy understanding, triple-beam interference with single lighting as shown in FIG. 4 will be described.

In FIG. 4, after a 0-th order diffraction light beam (intensity A), a primary diffraction light beam (intensity B+), and a – primary diffraction light beam (intensity B_) that have predetermined patterns have been transmitted through the projection optical system PL, they are changed to intensity A', intensity B+', and intensity B–', respectively. At this point, assuming that the wave number is denoted by k and the incident direction cosines of the primary diffraction light beam and – primary diffraction light beam to the image surface are denoted by s and t, respectively, and that coordinate and focal position are denoted by x and z, respectively, the intensity I of the image can be expressed by Formula (8).

$$I=A'^2+B_+'^2+B_-'^2+2A'B_+' \cos(k(sx+tz))+2A'B_-' \cos(k(sx-tz))+2B_+'B_-' \cos(2ksx) \quad (8)$$

"$\Delta ti_{rot}$" is an RMS value of a rotational symmetrical component $\Delta Ti_{rot}$ (ρ, θ) of a pupil transmittance distribution. Thus, when $\Delta ti_{rot}$ exists in triple-beam interference, even if images have the same pattern at the same focal position (z), $B_+'$ and $B_-'$ increase or decrease by the same amount from A' depending on the image heights. With reference to the image intensity I (Formula (8)) At this point, it is clear that contrasts of images that have the same pattern at the same focal position (z) vary depending on the image heights (coordinate x). In other words, $\Delta ti_{rot}$ represents non-uniformity of contrasts depending on the image heights. By the way, when the value is too large, even if the luminance is the same on all the screen, the widths of transferred patterns vary depending on the image heights in the photolithography.

"$\Delta ti_{odd}$" is an RMS value of an odd symmetrical component $\Delta Ti_{odd}$ (ρ, θ) of a pupil transmittance distribution. Thus, when there is $\Delta ti_{odd}$ in triple-beam interference, even if patterns are the same, as the focal position z is apart from the in-focal position, balances of B+ and B– vary. With reference to the image intensity I (Formula (8)) at this point, it is clear that even if patterns are the same, as the focal position z is apart from the in-focal position (defocused), the shapes of the images vary. In other words, $\Delta ti_{odd}$ represents asymmetry of shapes of pattern images at the focal positions. Note that when the value is too large, with a small defocusing amount, the shape of a transferred pattern varies.

"$\Delta ti_{evn}$" is an RMS value of an even symmetrical component $\Delta Ti_{evn}$ (ρ, θ) of a pupil transmittance distribution. Thus, when there is $\Delta ti_{evn}$ in triple-beam interference, with the same patterns, balances of B+ and B– vary depending on the orientations of the patterns. With reference to the image intensity I (Formula (8)) at this point, it is clear that even if images have the same pattern and the same image height (coordinate x), contrasts vary depending on the orientations (s, t) of the patterns. In other words, $\Delta ti_{evn}$ represents non-uniformity of contrasts depending on orientations of patterns. By the way, when the value is too large in the photolithography, there is a risk of which the widths of transferred patterns vary depending on arrangement directions of the patterns.

On the other hand, since the evaluation indexes wai, wa0, Δwai, δw0, and PSF correspond to a phase shift, they depend on wavefront aberration of a projection optical system PL.

In particular, since "wai" and "wa0" are an RMS value of an average phase shift distribution WAi (ρ, θ) and an RMS value of an average phase shift distribution WA0 (ρ, θ), respectively, they correspond to wavefront aberration of the projection optical system PL. By the way, the wavefront aberration that wai represents is with respect to an image point to be evaluated Xi. On the other hand, the wavefront aberration that wa0 represents is with respect to the center of the image X0.

"Δwai" is an RMS value of an average phase shift distribution WAi (ρ, θ) of an image point to be evaluated Xi based on the center of the image X0. Thus, Δwai corresponds to a difference (distraction, curve, and so forth) of wavefront aberration of a projection optical system PL depending on an image height.

"δwi" and "δw0" are an RMS value of a retardation distribution δWi (ρ, θ) and an RMS value of a retardation distribution δW0 (ρ, θ), respectively.

Generally, as retardation is large, the contrast of a pattern image deteriorates.

Thus, those evaluation indexes represent deterioration in a contrast of an image. Note that a contrast that δwi represents is with respect to an image point to be evaluated Xi, whereas a contrast that δw0 represents is with respect to the center of the image X0.

"PSF" corresponds to an approximate value of the maximum value of an image spread that depends on retardation and represents a characteristic of the image spread at the center of the image X0. As the value is small, the image spread deteriorates.

This is because when an optical system is a rotationally symmetrical type, as the influence of a coat to retardation at the center of the image, a characteristic of an uni-axial crystal of which the faster light ray axis radially distributes on an exit pupil surface may occur.

<Effects and Others>

As described above, according to the first embodiment, the evaluation indexes (t0, Δti, $\Delta ti_{rot}$, $\Delta ti_{odd}$, $\Delta ti_{evn}$, wai, wa0, Δwai, δwi, δw0, and PS) have been introduced.

It is supposed that as results of which a coat formed on the front surface of an optical device such as a lens or a mirror influences a light ray that enters the surface, there are a decrease of light intensity and a phase shift. The decrease of the light intensity and the amount of the phase shift due to the coat depend on the incident angle of the light ray.

Since those evaluation indexes base on states of individual light rays that exit at different exit angles and pass through the exit pupil surface PS at different positions, the influence of the coat is properly reflected in the evaluation indexes.

In particular, according to the first embodiment, since the evaluation indexes (t0, Δti, $\Delta ti_{rot}$, $\Delta ti_{odd}$, and $\Delta ti_{evn}$) according to a transmittance distribution have been introduced, image formation performance of the projection optical system PL can be evaluated with respect to a contrast.

In addition, according to the first embodiment, since evaluation indexes ($\Delta ti_{rot}$, $\Delta ti_{odd}$, and $\Delta ti_{evn}$) that represent a rotational symmetrical component, an odd symmetrical component, and an even symmetrical component of a difference Δti of image heights have been introduced, non-uniformity of contrasts depending on image heights, asymmetry of shapes of pattern images depending on focal positions, and non-uniformity of contrasts depending on orientations of patterns can be individually evaluated.

In addition, according to the first embodiment, since the evaluation indexes (Δti and Δwai) that represent the transmittance difference arising from differences among image heights have been introduced, image formation performance can be evaluated with respect to the transmittance difference arising from differences among image heights.

In addition, according to the first embodiment, when the evaluation indexes ($\Delta ti_{rot}$, $\Delta ti_{odd}$, and $\Delta ti_{evn}$) are obtained, the zernike expansion is applied. The zernike expansion is applied when wavefront aberration of an optical system is divided into individual aberration components. In the zernike expansion, various intrinsic characteristics of an optical system are considered in very detail. Thus, according to the first embodiment, those evaluation indexes can be individually and accurately obtained. In addition, since calculations for the zernike expansion (for example, function fitting and so forth) have been commonly performed, they can be relatively easily performed as an advantage thereof.

In addition, according to the first embodiment, since the evaluation indexes (wai, wa0, and Δwai) that represent an average phase shift distribution have been introduced, image formation performance of a projection optical system PL can be evaluated with respect to wavefront aberration.

In addition, according to the first embodiment, since the evaluation indexes (δwi and δw0) that represent a retardation distribution have been introduced, image formation performance can be evaluated with respect to a contrast of an image.

In addition, according to the first embodiment, since the evaluation index (PSF) that represents a characteristic of a point spread at the center of the image X0 has been introduced, image formation performance can be evaluated with respect to a characteristic of the point spread.

In addition, the evaluation indexes (t0, Δti, ...) according to a transmittance are with respect to non-uniformity of a contrast of a projection optical system PL, whereas the evaluation indexes (wai, wai0, ...) according to a phase shift are with respect to wavefront aberration of an optical system.

Thus, according to the first embodiment, image formation performance of a projection optical system PL can be evaluated from two independent facets. Viewed from this point, it is clear that the influence of a coat is accurately reflected in the evaluation according to the first embodiment.

Theoretically, each calculation performed by a computer may be manually performed. For the calculation there may be provided a storage medium on which the procedure(s) shown in either or both of FIG. 1 and FIG. 3 are stored, in order to read them by the computer. Also, a program for executing the procedure(s) may be read by the computer through the Internet instead of the storage medium.

In the procedure shown in FIG. 1, to obtain a pupil transmittance distribution, light rays are traced. However, as long as there is a projection optical system PL to be evaluated, the pupil transmittance distribution may be obtained in the following manner.

Light is entered from the object side (reticle surface R side) of the projection optical system PL. A light intensity distribution at the conjugate position on the exit pupil surface PS is measured.

In addition, according to the first embodiment, only a part of the evaluation indexes may be introduced.

In addition, according to the first embodiment, when each evaluation index is obtained for a plurality of image points to be evaluated Xi (for example, two points of the maximum image height X1 and the medium image height X2), (when the image points to be evaluated are two points of the maximum image height X1 and the medium image height X2, the evaluation indexes are t0, Δt1, Δt2, $\Delta t1_{rot}$, $\Delta t2_{rot}$, $\Delta t1_{odd}\Delta t2_{evn}$, wa1, wa2, wa0, Δwa1, Δwa2, δw1, δw2, and δw0), image format can be evaluated for each image height.

[Second Embodiment]

Next, with reference to FIG. 5, a second embodiment of the present invention will be described.

In the second embodiment, the first embodiment is applied to manufacturing (in particular, step S202 (coat allocation) that will be described later) of a projection optical system used for an exposure apparatus.

Next, the second embodiment will be described on the assumption that a projection optical system to be manufactured is a refractive projection optical system and that optical elements that compose the refractive projection optical system are a plurality of lenses. However, when a reflection type or reflection-refractive type projection optical system that has a reflection surface is manufactured, the present invention can be applied likewise (in this case, data of reflection surfaces is added to lens data).

Figure 5:
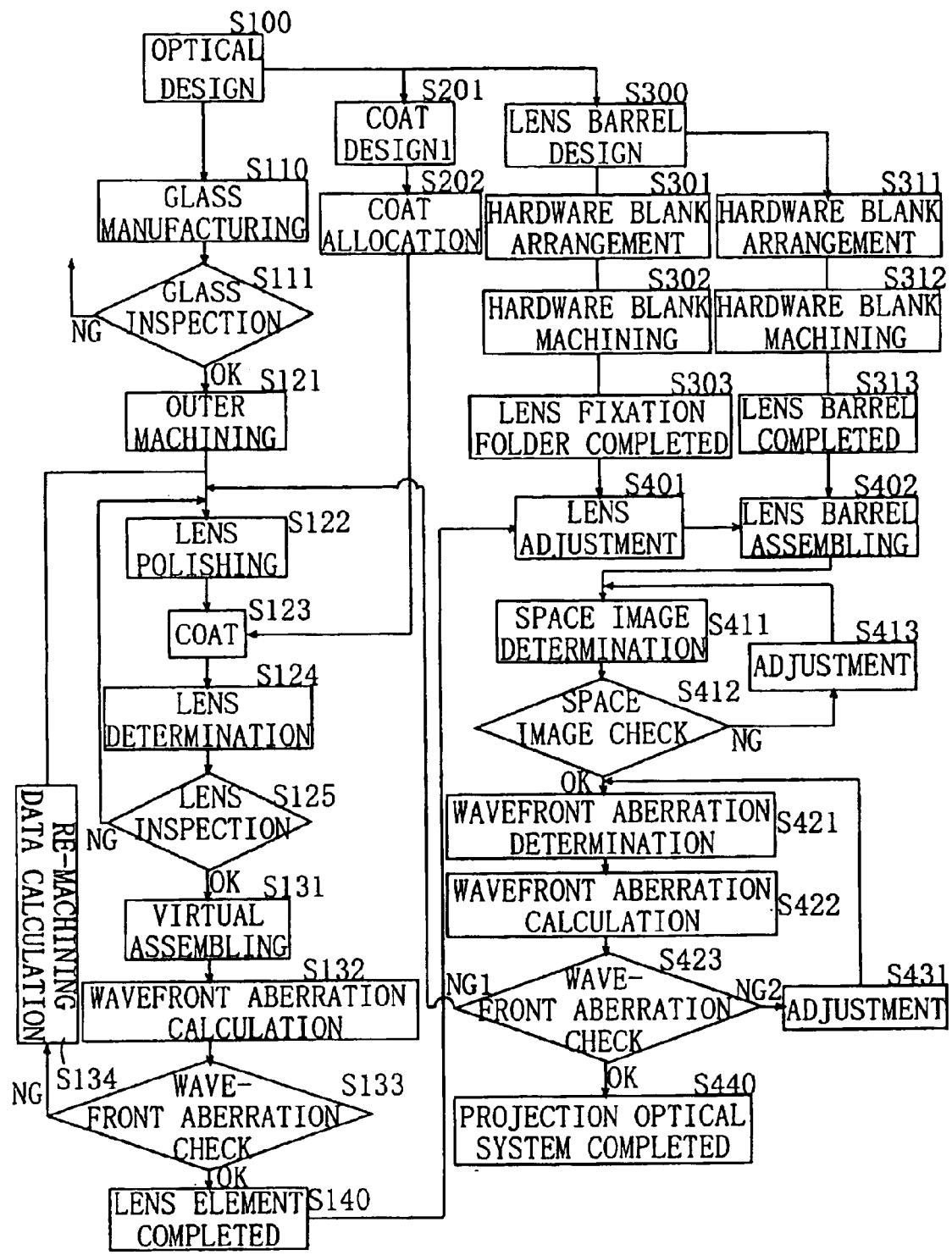
FIG. 5 is a flow chart showing a procedure according to a second embodiment.

FIG. 5 is a flow chart showing a procedure of the second embodiment.

(Step S100)

At step S100, an optical design for a projection optical system is performed so that an exposure apparatus satisfies a request spec. As a result, basic lens data is generated. As the request spec, there are for example a wavelength for use, a wavelength band, a full length (a distance between an object and an image), the maximum lens diameter, a working distance of an image on the object side, a working distance on the image side, and optical performance (a projection magnification, a numerical aperture on the image side, a diameter of an image field, telecentricity, aberration, and so forth). On the other hand, the basic lens data includes a curvature (a curvature radius) of each surface, a lens interval, a lens clear aperture (a lens outer diameter), a refractivity, an aspheric surface coefficient, a tolerance, and so forth of each of a plurality of lens.

(Step S201)

At step S201, a coat design is performed for a reflection protection coat formed on each lens that composes the projection optical system PL (when the projection optical system PL has a reflection surface, a reflection increase coat is designed). When the coat design is performed, the range of incident angles of light rays that enter each lens surface, wavelength for use, and wavelength band, which are calculated according to the basic lens data generated at step S100, are considered. In the coat design, various kinds of coat data that satisfies a desired reflectivity characteristic (transmittance characteristic) are obtained in those ranges. Each piece of coat data contains the number of layers, the thickness of each layer, a material of each layer, and when necessary an absorption coefficient of each layer.

(Step S202)

At step S202, a coat allocation is performed. In the coat allocation, each kind of coat data obtained at step S201 and the basic lens data generated at step S100 are referenced. When the coat allocation is performed, a coat having a structure defined with various kinds of coat data that have been numerically calculated is allocated to each lens surface of the projection optical system defined with the basic lens data. While the image formation performance of the projection optical system in the state is being evaluated, the allocating method is changed. As a result, coat allocation data in an optimum allocating method is obtained.

According to the second embodiment, evaluations are performed according to the first embodiment. For example, the evaluation indexes t0, $\Delta$ti, $\Delta$ti$_{rot}$, $\Delta$ti$_{odd}$, $\Delta$ti$_{evn}$, and PSF are obtained.

In addition, according to the second embodiment, for those evaluation indexes, coat allocation data that satisfies the following condition expressions (A) to (F) is obtained.

$$t0 \leq 0.04 \quad (A)$$

$$\Delta t \leq 0.032 \quad (B)$$

$$\Delta t_{rot} \leq 0.02 \quad (C)$$

$$\Delta t_{odd} \leq 0.024 \quad (D)$$

$$\Delta t_{evn} \leq 0.032 \quad (E)$$

$$PSF \geq 0.98 \quad (F)$$

In this case, the transmittance is obtained as a ratio of which the full transmission is 1.

When the condition expression (A) is satisfied, the width and shape of a transferred pattern by the projection optical system can be controlled to desired values with sufficient accuracy. When the condition expression (B) is satisfied, the width and shape of a transferred pattern can be kept regardless of an image position. When the condition expression (C) is satisfied, the difference of the widths of transferred patterns depending on image heights can be suppressed. When the condition expression (D) is satisfied, the variation of the shape of a transferred pattern due to defocusing can be suppressed. When the condition expression (E) is satisfied, the variation of the width of a transferred pattern depending on the alignment direction of the pattern can be suppressed. In addition, when the condition expression (F) is satisfied, a design solution for a coat allocation can be obtained so that the deterioration in the point spread is suppressed.

There are further preferred conditions expressed by the following condition expressions (A') to (E').

$$t0 \leq 0.02 \quad (A')$$

$$\Delta t \leq 0.016 \quad (B')$$

$$\Delta t_{rot} \leq 0.010 \quad (C')$$

$$\Delta t_{odd} \leq 0.012 \quad (D')$$

$$\Delta t_{evn} \leq 0.016 \quad (E')$$

In this case, the transmittance is obtained as a ratio of which the full transmission is 1.

(Step S110)

At step S110, according to the refractivity, the thickness, and the outer diameter of each lens of the basic lens data generated at step S100, the lens material is manufactured. In other words, a glass block having a predetermined diameter, thickness, and outer diameter is manufactured.

(Step S111)

At step S111, the refractivity distribution, transmittance distribution, and so forth of the glass block manufactured at step S110 are inspected. The inspection results are stored as refractivity distribution data and transmittance distribution data.

When the glass block satisfies the predetermined spec at step S111, the flow advances to step 121. Otherwise, the glass block is sent back.

(Step S121)

At step S121, after the glass block has been cut, the resultant glass block is polished to a desired sphere or plane by a polisher. At this point, the lens fringe is machined. Thereafter, the lens is rubbed with a sanding machine.

(Step S122)

At step S122, the lens surface is polished. The polishing is performed so that the curvature of the lens surface matches the curvature of the basic lens data generated at step S100.

(Step S123)

At step S123, a reflection protection coat is formed on the polished lens surface. At this point, it is determined that what coat is to be formed on what surface according to the coat allocation data obtained at step S202. In addition, the number of layers of coats, the thickness of each layer, and the material of each layer are determined according to the coat data obtained at step S201.

(Step S124)

At step S124, the polished lens surface is measured by an interferometer. As a result, lens shape data is obtained. At this point, the lens interval is also measured. The lens interval data is obtained. The lens shape data is not obtained with the transmission wavefront aberration of the lens element, but wavefront aberration according to interference fringes formed by reflected light on the front surface of the lens element.

(Step S125)

At step S125, it is determined whether or not the shape error of the lens element represented by the lens shape data and the lens interval data measured at step S125 has been suppressed to a predetermined value. When the shape error exceeds the predetermined value, the flow returns to step S122. At step S122, the lens surface is polished. In contrast, when the shape error have been suppressed to the predetermined value or lower, the flow advances to step S131.

(Step S131)

At step S131, virtual assembling data is generated. The virtual assembling data is generated according to the refractivity distribution data and transmittance distribution data of each lens obtained at step S111, the coat data and the coat allocation data obtained at step S202, the lens shape data and the lens interval data obtained at step S124, lens air interval data (lens element interval data) of the basic lens data generated at step S100, and the wavelength for use, the wavelength band, the working distance on the object side, the working distance on the image side, the projection magnification, the numerical aperture on the image side, the diameter of the image field, and so forth of the request spec. The format of the virtual assembling data is basically similar to that of the basic lens data.

(Step S132)

At step S132, an image formation simulation is performed according to the virtual assembling data obtained at step S131. As a result, wavefront aberration W is obtained. A coordinate system is defined on the exit pupil surface of the projection optical system that has been virtually assembled. The wavefront aberration W is expressed in the coordinate system. In addition, the wavefront aberration W is expanded to an orthogonal function system. According to the second embodiment, polar coordinates are used as the coordinate system. As the orthogonal function system, a zernike polynomial is used.

In other words, polar coordinates $(\rho, \theta)$ are defined on the exit pupil surface. The wavefront aberration W is expressed as $W(\rho, \theta)$. In this case, p represents a normalized pupil radius of which the radius of the exit pupil surface is normalized to 1, whereas $\theta$ represents a radius vector angle of polar coordinates of which the center of the exit pupil surface is the origin. The wavefront aberration $W(\rho, \theta)$ is zernike expanded by Formula (9).

$$W(\rho, \theta) = \Sigma E_n Z_n(\rho, \theta) \quad (9)$$

At step S132, it is preferred to output (obtain) an RMS value of the wavefront aberration W of the vertically assembled projection optical system, an RMS value of each term obtained by zernike-expanding the wavefront aberration W, or/and an RMS value of each term of which a plurality of terms obtained by zernike-expanding the wavefront aberration W.

When a plurality of terms obtained by the zernike expansion are grouped, they may be categorized as the following (a), (b), and (c).

(a) A term that does not contain $\theta$, namely a rotational symmetrical component $W_{rot}(\rho, \theta)$ that does not vary when rotated around the origin (the center of the exit pupil surface).

(b) A term that contains a trigonometric function that is greater than odd number times than $\theta$, namely an odd symmetrical component $W_{odd}(\rho, \theta)$ that does not vary when rotated around the original by 360°/odd number (c) A term that contains a trigonometric function that is greater even number times than $\theta$, namely an even symmetrical component $W_{evn}(\rho, \theta)$ that does not vary when rotated around the origin by 360°/even number By the way, the rotational symmetrical component $W_{rot}(\rho, \theta)$, the odd symmetrical component $W_{odd}(\rho, \theta)$, and the even symmetrical component $W_{evn}(\rho, \theta)$ can be expressed by the following formulas (10), (11), and (12), respectively.

$W_{rot}(\rho, \theta)$ $= E_1 + E_4(2\rho^2-1) + E_9(6\rho^4-6\rho^2+1)$ $+ E_{16}(20\rho^6-30\rho^4+12\rho^2-1)$ $+ E_{25}(70\rho^8-140\rho^6+90\rho^4-20\rho^2+1) \quad (10)$ $W_{odd}(\rho, \theta)$ $= E_2(\rho \cos \theta) + E_3(\rho \sin \theta) + E_7((3\rho^2-2)\rho \cos \theta)$ $+ E_8((3\rho^2-2)\rho \sin \theta) + E_{10}(\rho^3 \cos 3\theta)$ $+ E_{11}(\rho^3 \sin 3\theta) \quad (11)$ $W_{evn}(\rho, \theta)$ $= E_5(\rho^2 \cos 2\theta) + E_6(\rho^2 \sin 2\theta)$ $+ E_{12}((4\rho^2-3)\rho^2 \cos 2\theta)$ $+ E_{13}((4\rho^2-3)\rho^2 \sin 2\theta) + E_{17}(\rho^4 \cos 4\theta)$ $+ E_{18}(\rho^4 \sin 4\theta) + \quad (12)$ The number of orders of the zernike expansion is not limited to 36, but another value such as 16, or greater than 36.

(Step S133)

At step S133, it is determined whether the wavefront aberration W calculated at step S132 or an RMS value of each term obtained by zernike-expanding the wavefront aberration W satisfies the predetermined spec value.

It is assumed that the predetermined spec value has been designated so that the RMS value of each term obtained by zernike-expanding the wavefront aberration W or/and the RMS value of each term obtained by grouping a plurality of terms obtained by zernike-expanding the wavefront aberration W can be properly determined.

At step S133, when the determined result does not satisfy the predetermined spec value, the flow advances to step S134. In contrast, when the determined result satisfies the predetermined spec value, the flow advances to step S140. At step S140, the lens element is completed.

(Step S134)

At step S134, with the virtual assembling data obtained at step S131 as initial data, the lens shape and lens interval are optimized as variables so that the wavefront aberration (or the RMS value of each term obtained by zernike-expanding the wavefront aberration or/and the RMS value of each term obtained by grouping a plurality of terms obtained by zernike-expanding the wavefront aberration) satisfies the predetermined spec value. The optimized lens shape and lens interval are fed back to the virtual assembling data.

Thereafter, the flow returns to step S122. At step S122, the lens is polished so that the lens shape is optimized (correction polishing is performed). After steps S123 to S125 have been executed, steps S131 to S133 are executed again.

(Step S300)

At step S300, according to the basic lens data generated at step S100, a plurality of lens fixation folders that hold lens elements and a lens barrel that holds the lens fixation folders are designed.

(Step S301)

At step S301, a hardware blank is arranged according to the design data of the lens fixation folders.

(Step S302)

At step S302, the hardware blank obtained at step S301 is machined. As a result, the lens fixation folders are manufactured. Thereafter, the flow advances to step S303. At step S303, the lens fixation chambers are completed.

(Step S311)

At step S311, a hardware blank is arranged according to the design data of the lens barrel.

(Step S312)

At step S312, the hardware blank obtained at step S311 is machined. As a result, the mirror barrel is manufactured. Thereafter, the flow advances to step S313. At step S313, the mirror barrel is completed.

In the second embodiment, a barrel structure of which a plurality of lens fixation folders are disposed in the mirror barrel has been described. Thus, when only a plurality of lens fixation folders are assembled without a lens barrel, steps S311 to S313 are omitted.

(Step S401)

At step S401, the lens elements obtained at step S140 are assembled in the lens fixation folder obtained at step S303. At this point, the lens elements are adjusted so that the optical axis thereof has a desired relation to the lens fixation folder.

(Step S402)

At step S402, the lens fixation folders obtained at step S401 are assembled to the lens barrel. Thereafter, the flow advances to step S411.

(Step S411)

At step S411, a space image of the assembled projection optical system is measured.

(Step S412)

At step S412, the measured result obtained at step S411 is determined. When the measured result satisfies a measurement range of a wavefront aberration measuring device (at step S421, which will be described later), the flow advances to step S421. Otherwise, the flow advances to step S413.

(Step S413)

At step S413, an interval in the optical axis direction, an inclination to the optical axis, and a position on an optical axis orthogonal plane of each lens element that composes the projection optical system are adjusted. As a result, aberration of the projection optical system is compensated.

At steps S411 to S413, the space image has been measured and the projection optical system has been coarsely adjusted. Alternatively, a printed resist image may be measured and the projection optical system may be coarsely adjusted according to the measured result.

(Step S421)

At step S421, the wavefront aberration of the assembled projection optical system is measured by a wavefront aberration measuring device disclosed in for example Japanese Unexamined Patent Application Publication Nos. Hei 10-38757 and Hei 10-38758.

(Step S422)

Like at step S132, at step S422, the wavefront aberration measured at step S421 is zernike expanded. As a result, an RMS value of each term that has been obtained is calculated. Like at sep S132, instead of calculating the RMS of each term or in addition thereto, an RMS value of each term obtained by grouping a plurality of terms obtained by zernike-expanding the wavefront aberration may be calculated. Likewise, at step S422, the number of orders of the zernike expansion may be 16 or 36 or greater than 36.

(Step S423)

At step S423, it is determined whether or not each RMS value calculated at step S422 does not exceed a predetermined spec value.

At this point, if an RMS value of a high order component (any term of $n \geq 10$) of a plurality of terms obtained by zernike-extending the wavefront aberration W does not exceed the predetermined spec value and that of a low order component (any term of n=1 to 9) exceeds the predetermined spec value, the flow advances to step S421. By adjusting the interval in the optical axis direction, the inclination to the optical axis, and the position on the optical axis orthogonal plane of each lens element that composes the projection optical system, the wavefront aberration is properly compensated.

If an RMS value of a high order component (any term of $n \geq 10$) of a plurality of terms obtained by zernike-expanding the wavefront aberration exceeds the predetermined spec value, the flow returns to step S122. This is because by adjusting only the interval in the optical axis direction, the inclination to the optical axis, and the position on the optical axis orthogonal plane of each lens element that composes the projection optical system, the wavefront aberration cannot be compensated. Thus, the flow returns to step S122.

When the RMS value of each of all the terms obtained by zernike-expanding the wavefront aberration does not exceed the predetermined spec value, the flow advances to step S440. At step S440, the projection optical system is completed.

(Step S431)

At step S431, according to the RMS value of a low order component (n=1 to 9) calculated at step S422, the interval in the optical axis direction, the inclination to the optical axis, and the position on the optical axis orthogonal plane of each lens element are adjusted. Thereafter, the flow advances to step S421.

According to the second embodiment, since the coat allocation at step S202 is performed according to the evaluation according to the first embodiment, the influence of the coats are properly removed. In addition, according to the second embodiment, since each evaluation index satisfies the condition expressions (A) to (D), the width and shape of a transferred pattern by the projection optical system can be controlled to desired values with sufficient accuracy. The width and shape of a transferred pattern can be kept regardless of an image position. The difference of the widths of transferred patterns depending on image heights can be suppressed. The variation of the shape of a transferred pattern due to defocusing can be suppressed. The variation of the width of a transferred pattern depending on the arrangement direction of the pattern can be suppressed. In addition, the deterioration in the point spread can be suppressed. When each evaluation index satisfies the condition expressions (A') to (B'), the image formation performance is further improved.

[Third Embodiment]

Next, with reference to FIG. 6, a third embodiment of the present invention will be described.

In the third embodiment, as example 1 to example 4, the first embodiment is applied to a lens design (lens correction) of an optical system.

FIG. 6 is a table showing correction targets, evaluation indexes, and optimization parameters in the lens design (lens correction) of example 1 to example 4 according to the third embodiment.

EXAMPLE 1

As a correction target, design data or wavefront aberration $W^{(t)}$ that the designer desires is selected. By adding coat data to lens data according to the first embodiment and tracing polarized light, wavefront aberration WA (according to an average phase shift distribution WAi according to the first embodiment) is calculated. In addition, according to the third embodiment, while the wavefront aberration WA is being calculated, an optimization is performed so that the wavefront aberration WA becomes close to the correction target $W^{(t)}$.

As optimization parameters, lens parameters—namely, a curvature of a lens (a curvature radius), a lens surface interval (a lens interval and a center thickness), a refractivity (a material), an aspheric surface coefficient (rotational symmetry and non-rotational symmetry), a type of a design solution (coat data) of a coat, the number of layers of coats, a thickness of each layer, a material of each layer (a refractivity), a spot (rotational symmetry and non-rotational symmetry) of a coat are selected.

EXAMPLE 2

By adding coat data to lens data according to the first embodiment beforehand and tracing polarized light, wavefront aberration WA (according to an average phase shift distribution WAi according to the first embodiment) is obtained.

On the other hand, beforehand, by tracing light rays with only the lens data, wavefront aberration WAL that is obtained with only the lens data rather than coat data is obtained.

By subtracting the wavefront aberration WAL from the wavefront aberration WA, wavefront aberration WAC obtained with only a coat is obtained.

When the optimization is performed, since the wavefront aberration WAC is treated as a constant, it is denoted by "WACconst".

Thereafter, as a correction target, design data or wavefront aberration $W^{(t)}$ that the designer desires is selected.

Thereafter, wavefront aberration WAL generated with only the lens data is calculated. In this case, the sum of the calculated wavefront aberration WAL and the pre-obtained wavefront aberration WACconst is pseudo-treated as overall wavefront aberration generated by both the coat data and the lens data. While the calculation is being performed, the optimization is performed so that the sum becomes close to the correction target $W^{(t)}$.

As optimization parameters, when the optimization is performed, if light rays are traced as scalars, lens parameters are selected.

When the optimization is performed, if polarized light is traced, with data that represents variation of wavefront aberration according to coat parameters introduced for each surface, as optimization parameters, coat parameters are selected.

EXAMPLE 3

By adding coat data to lens data according to the first embodiment beforehand and tracing polarized light, wavefront aberration WA (according to an average phase shift distribution WAi according to the first embodiment) is obtained.

On the other hand, by tracing light rays with only lens data beforehand, wavefront aberration WAL generated with only lens data rather than coat data is obtained.

When the optimization is performed, since the wavefront aberrations WA and WAL are treated as constants, they are denoted by "WACconst" and "WAL const".

Thereafter, as a correction target, design data or wavefront aberration $W^{(t)}$ that the designer desires is selected. Wavefront aberration WAL generated with only lens data is calculated. In this case, a value of which the difference between the wavefront aberrations WACconst and WALconst, which have been obtained beforehand, is added to the newly calculated wavefront aberration WAL is pseudo-treated as the overall wavefront aberration generated with both the coat data and the lens data. While the calculation is being performed, the optimization is performed so that the added value becomes close to the correction target $W^{(t)}$.

As optimization parameters, when the optimization is performed, if light rays are traced as scalars, lens parameters are selected.

When the optimization is performed, if polarized light is traced, with data that represents variation of wavefront aberration according to coat parameters introduced for each surface, as optimization parameters, coat parameters are selected.

EXAMPLE 4

By adding coat data to lens data according to the first embodiment beforehand and tracing polarized light, wavefront aberration WA (according to an average phase shift distribution WAi according to the first embodiment) is obtained. When the optimization is performed, since the wavefront aberration WA is treated as a constant, it is denoted by "WAconst".

Thereafter, with the wavefront aberration WAconst as a correction target, while wavefront aberration WAL that is generated with only lens data is being calculated, the optimization is performed so that the calculated wavefront aberration WAL becomes close to the correction target WAconst.

However, in that example, a value of which the sign of the obtained correction amount is inverted is designated as a correction amount with which lens data is optimized.

As optimization parameters, when the optimization is performed, if light rays are traced as scalars, lens parameters are selected.

When the optimization is performed, if polarized light is traced, with data that represents variation of wavefront aberration according to coat parameters introduced for each surface, as optimization parameters, coat parameters are selected.

In each example of the third embodiment, a lens design (lens correction) is performed according to the first embodiment. In other words, a lens design (lens correction) is performed according to an evaluation in which the influence of a coat on a lens is accurately influenced.

Thus, the influence of the coat is properly removed. As a result, an optical system having good image formation performance can be obtained.

In each example, when the optimization is performed, light rays (or polarized light) are traced. However, when "a varying rate of an evaluation amount of each optimization parameter to become close to the correction target" is known (has been obtained beforehand), if the varying amount of each optimization parameter is small, the following relation is approximately satisfied.

Evaluation amount'=evaluation amount+varying rate×varying amount of each optimization parameter Thus, without need to trace light rays (or polarized light), an optical system can be optimized.

In this case, since the calculation time necessary for tracing light rays (or polarized light) is shortened, the efficiency of the optimizing calculation becomes very high (evaluation amount' is an evaluation amount after each optimization parameter has been varied).

In each example of the third embodiment, as an evaluation index that represents image formation performance of an optical system, wavefront aberration is introduced. Alternatively, instead of the wavefront aberration or in addition thereto, a complex amplitude transmittance (according to a pupil transmittance distribution Ti according to the first embodiment) may be introduced. Without need to say, when both the wavefront aberration and the complex amplitude transmittance are introduced, better image formation performance can be obtained.

[Fourth Embodiment]

Next, with reference to FIG. 7, a fourth embodiment of the present invention will be described.

In the fourth embodiment, when each optical element of an optical system (for example, a projection optical system PL) has retardation, image formation performance of the optical system is evaluated with an evaluation index according to a phase shift.

When an optical element has retardation, a polarized component that vibrates in a first direction of a light beam that passes through the optical element and a polarized component that vibrates in a second direction orthogonal to the first direction have a phase difference (difference of phase shifts).

When the optical element is a crystal material that is a uni-axial or bi-axial crystal, a phase difference (including ray separation) in the crystal material which occurs due to a separation of a normal ray and an abnormal ray causes retardation in an optical element. When the crystal material is an isometric (cubic) system crystal such as calcium fluoride, spatial dispersion in the crystal material causes the retardation.

Regardless of a crystal material or an amorphous material, causes of occurrence of retardation are for example internal stress distortion and external stress distortion of an optical element, thermal stress distortion of an optical element due to radiation, a coat like the forgoing embodiments, and so forth.

When a crystal material spatially disperses, depending on the propagation direction of light in the crystal material, phases delay or advance. As a result, there is a birefringence distribution depending on directions to crystal axes.

For details about spatial dispersion of a crystal material, refer to "Crystal Optics with Spatial Dispersion, and Excitons", written by Agranovich Vladimir Moiseevich, Springer-Verlag Publishing, 1984.

Figure 7:
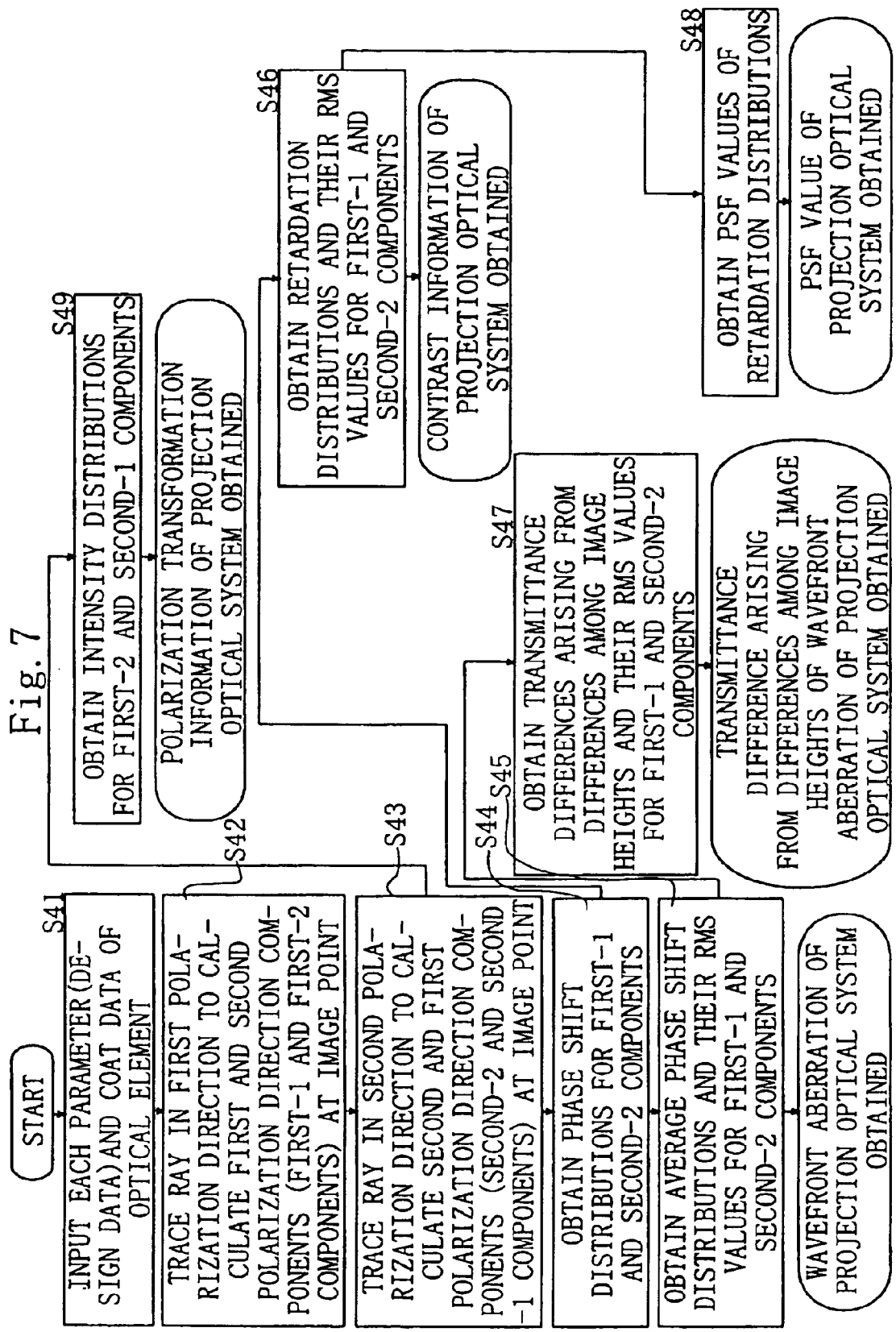
FIG. 7 is a flow chart showing a procedure for obtaining an evaluation index corresponding to a phase shift of an optical system according to a forth embodiment.

FIG. 7 is a flow chart showing a procedure for obtaining an evaluation index according to a phase shift of an optical system according to the fourth embodiment. The procedure according to the fourth embodiment is executed by a computer.

(Step S41)

At step S41, design parameters of a projection optical system are input to a computer. According to the fourth embodiment, design parameters are a shape, an interval, eccentricity, an inclination to an optical axis, an azimuth angle to an optical axis, a refractivity, a birefringence distribution (and/or a retardation distribution), a reflectivity, a transmittance, a transmittance distribution, a clear aperture, and a tolerance of each optical element that composes the projection optical system. The design parameters are also a structure of each coat formed on the front surface of each optical element—namely, the number of layers of coats, a thickness of each layer, a material of each layer, (and when necessary, an absorption coefficient).

(Step S42)

Thereafter, the computer traces a light ray that is a first polarized component that vibrates in a first direction on an incident pupil surface of the projection optical system and calculates a light ray to be a first polarized component (first-1 component) and a light ray to be a second polarized component (first-2 component) on an exit pupil surface of the projection optical system.

According to the fourth embodiment, as the first and second polarized components, for example an X polarized component that vibrates in a predetermined X direction on an incident pupil (exit pupil) surface of the projection optical system and an Y polarized component that vibrates in a Y direction orthogonal to the X direction can be used.

Alternatively, as the first and second polarized components, an R polarized component that vibrates in a direction that contains an optical axis (radiation direction R) on the incident pupil (exit pupil) surface and a θ polarized component that vibrates in a direction orthogonal to the R polarized component (a polarized component that vibrates in a tangential direction θ) may be used. In addition, as the first and second polarized components, right-handed circularly polarized light and left-handed circularly polarized light on the incident pupil (exit pupil) surface may be used. Alternatively, at least two sets (namely four) of the X and Y polarized components, R and θ polarized components, and left-handed and right-handed circularly polarized components may be used.

(Step S43)

At step S43, the computer traces a light ray to be a second polarized component that vibrates in a predetermined second direction on the incident pupil surface of the projection optical system and calculates a light ray to be a second polarized component (second-2 component) on the exit pupil surface of the projection optical system and a light ray to be a first polarized component (second-1 component) on the exit pupil surface.

For convenience, the fourth embodiment shows that step S42 is followed by step S43. Alternatively, step S42 may be preceded by step S43.

(Step S44)

Like at step S32 of the first embodiment, at step S44, with respect to the polarized components of the first-1 component and the second-2 component, a first direction phase shift distribution and a second direction phase shift distribution of a light beam that enters any image point to be evaluated Xi and a first direction phase shift distribution and a second direction phase shift distribution of a light beam that enters the center of the image X0 are calculated.

(Step S45)

Like at step S33 of the first embodiment, at step S45, with respect to the polarized components of the first-1 component and the second-2 component, the computer calculates average phase distributions at the image point to be evaluated Xi and the center of the image X0.

(Step S46)

Like at step S34 of the first embodiment, at step S46, with respect to the polarized components of the first-1 component and the second-2 component, the computer obtains retardation distributions at the center of the image X0 and an RMS value thereof.

(Step S47)

Like at step S35 of the first embodiment, at step S47, with respect to the polarized components of the first-1 component and the second-2 component, the computer obtains average phase shift distributions (transmittance difference arising from differences among image heights) at the image point to be evaluated Xi based on the center of the image X0 and RMS values thereof.

(Step S48)

Like at step S36 of the first embodiment, at step S48, with respect to the polarized components of the first-1 component and the second-2 component, the computer obtains PSF values.

(Step S49)

At step S49, with respect to the first-2 component and the second-1 component of the light beam that enters the image point to be evaluated Xi, the computer calculates an intensity distribution (or an amplitude distribution) on the exit pupil surface PS.

In this case, the intensity distributions of the first-2 component and the second-1 component on the exit pupil surface PS are represented in polar coordinates ($\rho$, $\theta$) as polarization transformation distributions $P_{1\text{-}2}i$ ($\rho$, $\theta$) and $P_{2\text{-}1}i$ ($\rho$, $\theta$) of the light beam that enters the image point Xi to be evaluated, respectively.

Likewise, with respect to the first-2 component and the second-1 component of the light beam that enters the center of the image X0, intensity distributions (or amplitude distributions) on the exit pupil surface PS are calculated.

The intensity distributions of the first-2 component and the second-1 component on the exit pupil surface PS are expressed in polar coordinates ($\rho$, $\theta$) as polarization transformation distributions $P_{1-2}0$ ($\rho$, $\theta$) and $P_{2-1}0$ ($\rho$, $\theta$) of the light beam that enters the center of the image X0, respectively.

The computer obtains those polarization transformation distributions $P_{1-2}i$ ($\rho$, $\theta$), $P_{2-1}i$ ($\rho$, $\theta$) $P_{1-2}0$ ($\rho$, $\theta$), and $P_{2-1}0$ ($\rho$, $\theta$) as evaluation indexes.

Alternatively, the intensity distributions (or amplitude distributions) of the first-1 component and the second-2 component on the exit pupil surface PS may be calculated. The maximum values of the polarization transformation distributions $P_{1-2}i$ ($\rho$, $\theta$), $P_{2-1}i$ ($\rho$, $\theta$) $P_{1-2}0$ ($\rho$, $\theta$), and $P_{2-1}0$ ($\rho$, $\theta$) according to the maximum values of the intensities of the first-1 component and the second-2 component may be treated as evaluation indexes.

Alternatively, an RMS value of each term obtained by zernike-expanding those polarization transformation distributions $P_{1-2}i$ ($\rho$, $\theta$), $P_{2-1}i$ ($\rho$, $\theta$) $P_{1-2}0$ ($\rho$, $\theta$), and $P_{2-1}0$ ($\rho$, $\theta$) and/or an RMS value of each term obtained by grouping a plurality of terms obtained by zernike-expanding them may be treated as evaluation indexes.

<About Each Evaluation Index>

According to the fourth embodiment, since only the evaluation indexes $P_{1-2}i$ ($\rho$, $\theta$), $P_{2-1}i$ ($\rho$, $\theta$) $P_{1-2}0$ ($\rho$, $\theta$), and $P_{2-1}0$ ($\rho$, $\theta$) obtained at step S49 are different from those of the first embodiment, only those evaluation indexes will be described in the following.

"$P_{1-2}i$ ($\rho$, $\theta$), $P_{2-1}i$ ($\rho$, $\theta$)" represent intensity distributions of components that have been transformed into the polarized direction orthogonal to the incident polarized light of the light beam that reaches the image point to be evaluated Xi.

On the other hand, "$P_{1-2}0$ ($\rho$, $\theta$), and $P_{2-1}0$ ($\rho$, $\theta$)" represent intensity distributions of components that have been transformed into the polarized direction orthogonal to the incident polarized light of the light beam that reaches the center of the image X0.

When such polarization transformation occurs, the pattern transfer accuracy may undesirably depend on line widths or pitches at the time a pattern is transferred by the photolithography.

Thus, it is preferred that the intensities of the first-2 component and the second-1 component of the light beam should be $\frac{1}{100}$ of or smaller than the intensities of the first-1 component and the second-2 component of the light beam.

In this case, the line width dependency and the pitch dependency of the pattern transfer accuracy can be prevented. As a result, a pattern can be transferred with high accuracy.

[Fifth Embodiment]

Next, with reference to FIG. 8, a fifth embodiment of the present invention will be described.

The fifth embodiment is an example of which the fourth embodiment is applied to a lens design for an optical system (for example, a projection optical system PL).

Figure 8:
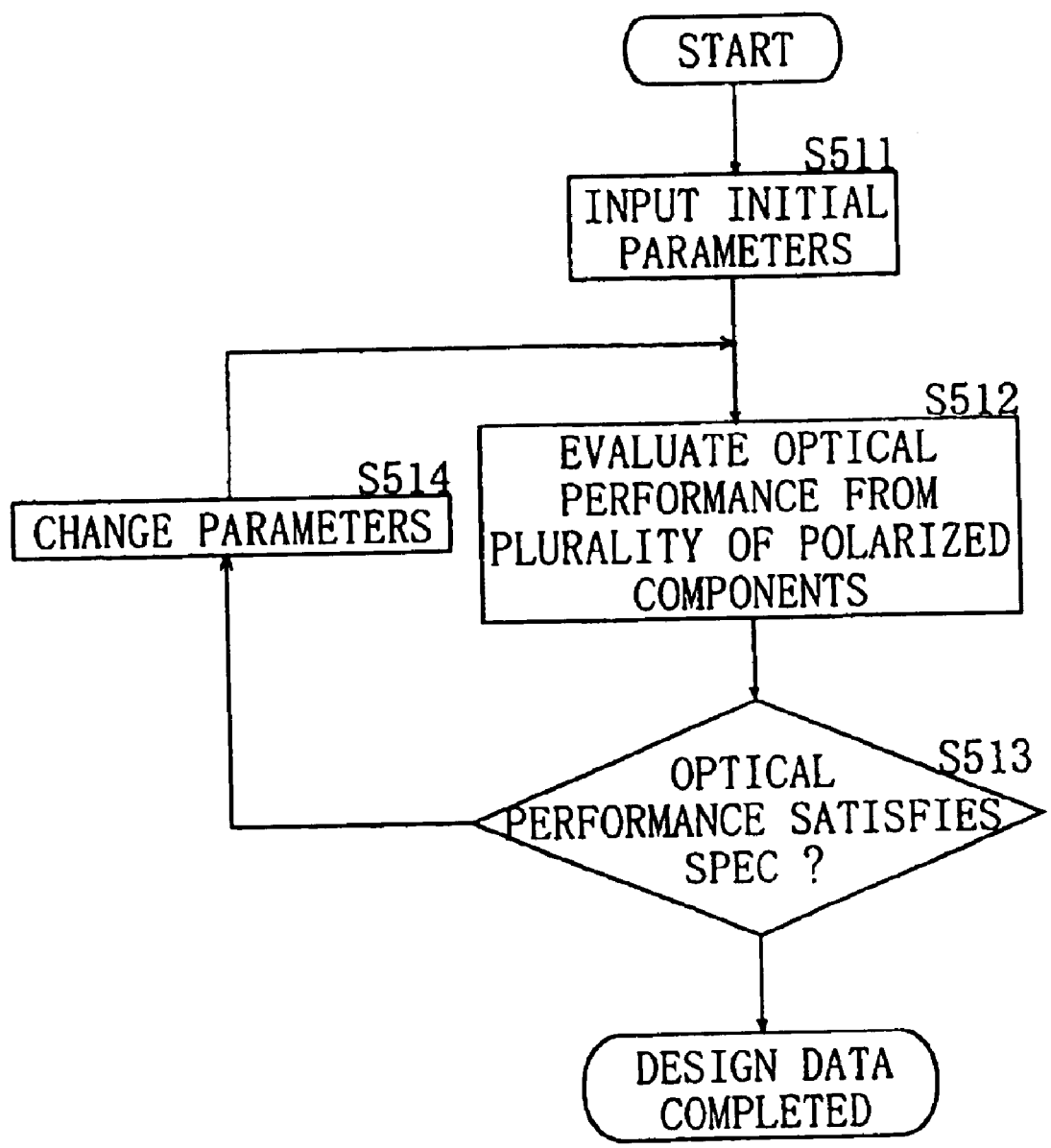
FIG. 8 is a flow chart showing an outline of a design procedure according to a fifth embodiment.

FIG. 8 is a flow chart schematically showing a design procedure according to the fifth embodiment.

As shown in FIG. 8, according to the fifth embodiment, there are steps S511, S512, S513, and S514. At step S511, initial values of design parameters are input. At step S512, an optical performance of the projection optical system is evaluated with a plurality of polarized components according to the design parameters. At step S513, it is determined whether or not the optical performance calculated at step S512 satisfies a predetermined spec. At step S514, when the optical performance does not satisfies the predetermined spec, the design parameters are changed.

Step S511 of the fifth embodiment is the same as step S41 of the fourth embodiment. Step S512 of the fifth embodiment is the same as steps S42 to S49 of the fourth embodiment. Thus, their description will be omitted.

(Step S513)

At step S513, the computer determines whether or not image formation performance (for example, an average phase distribution, a retardation distribution, their RMS value and PSF value, and a polarization transformation distribution) calculated at step S512 satisfies the predetermined spec. When the image formation performance satisfies the predetermined spec, the design data is output and the design procedure is completed. In contrast, when the calculated optical performance does not satisfy the spec, the flow advances to step S514.

(Step S514)

At step S14, the computer changes at least a part of the design parameters of the projection optical system. Then, the flow advances to step S512. According to the fifth embodiment, the computer repeats that loop until the calculated optical performance satisfies the predetermined spec.

The design parameters may be changed in the following manner.

At first, the computer changes only parameters of the optical system composed of only an amorphous material (these parameters are for example a surface shape, a surface interval, eccentricity, an inclination to an optical axis, a refractivity, a clear aperture, a tolerance, and so forth) of each optical element (a lens, a reflection surface, and so forth) that compose the projection optical system and compensates aberration of scalar components of the image formation performance of the projection optical system. Thereafter, the computer changes the structure of a coat on the front surface and a birefringence distribution of each optical element. When each optical element is made of a crystal material, the computer changes parameters such as an azimuth of a crystal axis. As a result, the computer compensates the aberration of the scalar components and polarized components.

According to the fifth embodiment, even if an optical element that composes an optical system has retardation, the image formation performance for both scalar components and polarized components can be optimized.

[Sixth Embodiment]

Next, with reference to FIG. 9, a sixth embodiment of the present invention will be described.

The sixth embodiment is an example of which the fifth embodiment is applied to a manufacturing method for a projection optical system suitable for an exposure apparatus used for manufacturing an optical system in particular a microdevice by the photolithography process.

Figure 9:
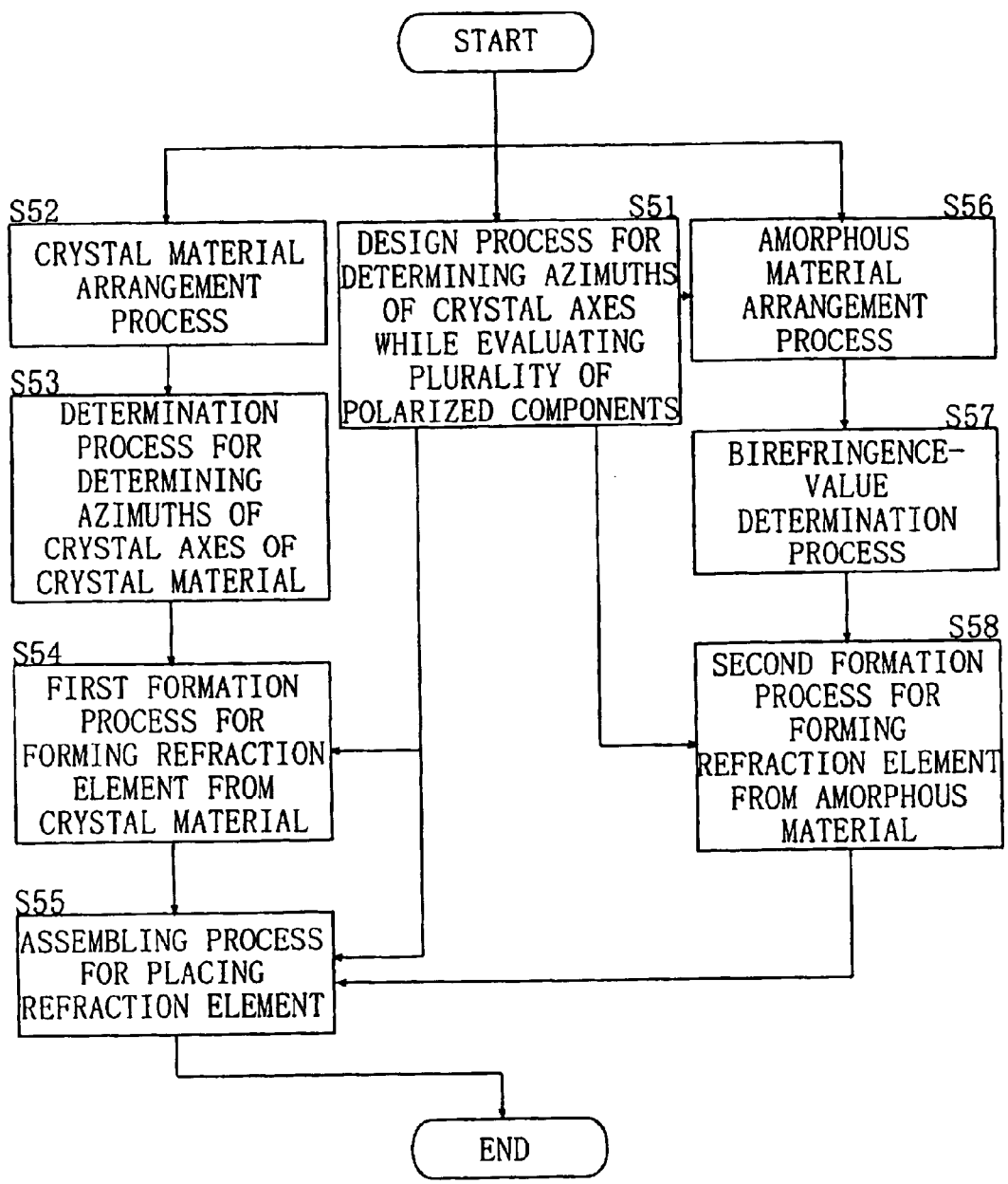
FIG. 9 is a flow chart showing an outline of a manufacturing method of a projection optical system according to a sixth embodiment.

FIG. 9 is a flow chart showing an outline of a manufacturing method for a projection optical system according to the sixth embodiment.

As shown in FIG. 9, according to the sixth embodiment, the manufacturing method for a projection optical system comprises a design process S51, a crystal material arrangement process S52, a crystal axis determination process S53, a first element formation process S54, an amorphous material arrangement process S56, a birefringence-value determination process S57, a second element formation process S58, and an assembling process S55.

The design process S51 has steps S511 to S514 that are design processes of the fifth embodiment.

In reality, when a projection optical system is designed using ray-tracing software (under a computer), light rays of a plurality of polarized components are traced. An aberration of each polarized component is calculated. Preferably, a wavefront aberration of each polarized component is calculated. With respect to the aberration of each of a plurality of polarized components and a scalar aberration that is a combined scalar component of the polarized component aberrations, while the projection optical system is being evaluated, parameters of a plurality of optical elements (refraction elements, reflection elements, diffraction elements, and so forth) that compose the projection optical system are optimized. As a result, design data composed of those parameters is obtained.

As those parameters, in addition to conventional parameters such as a surface shape of each optical element, a surface interval of each optical element, a refractivity of each optical element, and so forth, when each optical element is made of a crystal material, an azimuth of a crystal axis, a spatial dispersion, a birefringence distribution, and so forth are used. When each optical element is made of an amorphous material, a birefringence distribution thereof is used.

According to the sixth embodiment, although a birefringence distribution of each optical element made of an amorphous material is used as a parameter, when the image formation performance can be optimized with only parameters such as a direction of a crystal axis, and an azimuth of a crystal axis of each optical element made of a crystal material or when each optical element that composes the optical system is made of only a crystal material, a birefringence distribution of an optical element made of an amorphous material is not used as a parameter. In this case, the amorphous material arrangement process S56, the birefringence-value determination process S57, and the second element formation process S58 shown in FIG. 9 are not used.

In the crystal material arrangement process S52, an isometric (cubic) system crystal material (of which the unit lengths of crystal axes are mutually the same and the angle of the point of intersection of each crystal axis is 90°) that has a light transmission characteristic to a wavelength of the projection optical system.

In the crystal axis determination process S53, the crystal axes of the crystal material arranged in the crystal material arrangement process S52 are determined.

As applicable methods for the determining there are some methods such as a method for performing Laue measurement and directly measuring azimuths of crystal axes or a method for measuring birefringence of a crystal material and determining azimuths of the crystal axes with the measured birefringence according to the relation between known azimuths of crystal axes and birefringence value.

In the first element formation process S54, the crystal material arranged in the crystal arrangement process is machined (polished). This machine process is performed so that the parameters obtained in the design process S51 (design parameters) are applied to the refraction element.

According to the sixth embodiment, the order of the crystal axis determination process S53 and the first element formation process S54 can be changed.

For example, when the first element formation process S54 is performed first, the crystal axes of the crystal material machined in the shape of a refraction element are determined. When the crystal axis determination process S53 is performed first, information of the azimuths of the crystal axes is applied to the refraction element or a holding element that holds the refraction element so that the crystal axes that have been determined are obtained after the refractive element had been formed.

Next, the amorphous material arrangement process S56 will be described. According to the sixth embodiment, as an amorphous material, silica or fluorine-doped silica (hereinafter referred to as modified silica) is used. Unlike with an optical crystal, such silica and modified silica do not have birefringence in an ideal state.

However, when silica or modified silica contains impurities or when heated silica is annealed and a temperature distribution occurs, birefringence occurs due to an internal stress.

Thus, according to the sixth embodiment, the amount and type of impurities doped to an ingot or a thermal history is adjusted so that silica or modified silica has a desired birefringence distribution.

According to the sixth embodiment, when silica is arranged and annealed, the arranging condition and the thermal history condition are adjusted so that the birefringence distribution of the refraction element made of silica satisfies the birefringence distribution calculated in the design process S51.

As parameters of the arranging conditions, there are a burner structure, a gas flow rate, an exhaust gas flow rate, a target oscillation pattern, and so forth. Such arranging and annealing conditions may be determined empirically, or through trials and errors.

Next, the birefringence-value determination process S57 will be described. In the birefringence-value determination process S57, the birefringence distribution of the amorphous material made of silica or modified silica obtained in the amorphous material arrangement process S56 is measured. In the birefringence-value determination process S57, it is preferred to determine the refractivity distribution of the amorphous material.

In the second element formation process S58, each lens that compose the projection optical system is manufactured. When necessary, those materials have been polished from the amorphous materials (typically, disc-shaped materials) whose birefringence distribution and refractivity distribution have been determined in the birefringence-value determination process S57.

In other words, according to a known polishing process, the surface of each lens is polished according to the surface shape and surface interval of the design data. Thus, a refraction element having lens surfaces in predetermined shapes is manufactured.

Like in the first element formation process S54, in the second element formation process S58, while the error of the surface shape of each lens is being determined by an interferometer, it is repeatedly polished until the determined surface shape satisfies a predetermined range. Thus, the surface shape of each lens becomes close to the target surface shape (best fit sphere shape).

In the assembling process S55, the machined refraction element is assembled into the lens barrel of the projection optical system according to the design data obtained in the design process S51. At this point, the refraction element made of an isometric (cubic) system crystal material is aligned to the azimuths of the crystal axes of the design data obtained in the design process S51.

Alternatively, in the assembling process S55, the image formation performance of each polarized component of the projection optical system that has been actually assembled may be measured according to the evaluation indexes of the fourth embodiment.

As was described above, according to the manufacturing method for the projection optical system according to the sixth embodiment, the influence of the birefringence due to the isometric (cubic) system crystal material such as fluorite or barium fluoride is evaluated with respect to a plurality of polarized components. The building angles of the crystal axes of the refraction element made of the isometric (cubic) system are designated so that the influence (polarization aberration) of the birefringence becomes minimum. The influence (polarization aberration) of the birefringence that cannot be compensated by the optimization of the azimuths of the crystal axes can be compensated by an amorphous refraction element. Thus, good optical performance can be obtained.

[Seventh Embodiment]

Next, with reference to FIG. 10, a seventh embodiment of the present invention will be described.

The seventh embodiment is an embodiment of an exposure apparatus that has a projection optical system manufactured according to the sixth embodiment.

FIG. 10 is a schematic diagram showing an outline of an exposure apparatus according to the seventh embodiment.

In FIG. 10, a pulse beam emitted from a light source 40 that is an ArF excimer laser that supplies a pulse beam having a wavelength of for example 193 nm travels along X direction. The pulse beam is deflected by a path folding prism 41. The deflected pulse beam enters a diffractive optical element (DOE) disposed on a DOE turret 42. The DOE turret 42 has a plurality of diffractive optical elements of different types.

Each of the diffractive optical elements transforms an incident light beam so that it has a predetermined sectional shape for example a circular section, an annular-shaped section, and a multi-pole section (a plurality of poles that are eccentric to a reference optical axis) in a far field region.

Light beams diffracted by the diffractive optical elements are collected by a condenser lens block 43. In the vicinity of the position of a micro fly's eye lens 44, the far field regions of the diffractive optical elements are formed.

The micro fly's eye lens 44 has a structure of which a plurality of lens surfaces arranged in a two-dimensional matrix shape are integrally formed on one or a plurality of substrates. Alternatively, instead of the micro fly's eye lens 44, a fly's eye lens having a plurality of lens elements integrated in a two-dimensional matrix shape may be used.

In addition, the condenser lens block disposed between the diffractive optical elements and the micro fly's eye lens 44 is preferably a zoom lens system or a variable lens system that will be described later.

In the zoom lens system, by moving a lens in the direction of the optical axis, the focal length can be continuously varied. In the variable lens system for example a multi-focal length lens system, by changing a lens, the focal length can be changed not continuously.

A two-dimensional light source (surface light source) composed of a plurality of light source images is formed on an exit surface of the micro fly's eye lens 44. Virtual images of a plurality of light sources may be formed at the position of an incident surface of the micro fly's eye lens 44 (or the fly's eye lens).

Beams emitted from the two-dimensional light sources are collected by a condenser lens system 45. The condensed beam overlaps and illuminates a variable field diaphragm 46.

A beam that exits from the variable field diaphragm 46 reaches a reticle R as a projection original disposed on a first surface through a blind imaging optical system 47a to 47c.

The blind imaging optical system 47a to 47 almost conjugates an aperture portion of the variable field diaphragm 46 and the reticle R as the projection original disposed on the first surface.

According to the seventh embodiment, two optical path folding mirrors 48a and 48b are disposed in the blind imaging optical system 47a to 47c. The mirrors 48a and 48b deflect the optical path by around 180°.

Beams emitted from the blind imaging optical system 47a to 47c forms for example a slit-shaped lighting field at a part of a pattern forming region of the reticle R.

A beam that exits from the lighting field reaches a wafer W as a workpiece (a photosensitive substrate) disposed on a second surface of the projection optical system through the projection optical system manufactured by the manufacturing method according to the sixth embodiment. An image of the pattern in the slit-shaped lighting field is formed on the wafer W.

In addition, according to the seventh embodiment, a reticle stage RS that holds the reticle R on the first surface and a wafer stage that holds the wafer W on the second surface can be traveled in the Y direction.

Assuming that the magnification of the projection optical system is denoted by β, while the reticle stage RS and the wafer stage WS are being traveled in the ratio of the magnification β, the workpiece W is exposed. As a result, a pattern image of the reticle R is transferred onto the wafer WS, in particular, an area of which the slit-shaped image formation area is swept in the Y direction (typically, a rectangular shot area).

After one shot area has been scanned and exposed, the wafer stage WS is driven and the next shot area is scanned and exposed. By repeating those processes, a plurality of shot areas are formed on almost all the surface of the wafer W.

As the seventh embodiment, an example of which the projection optical system manufactured by the manufacturing method according to the sixth embodiment is applied to a scanning exposure apparatus. However, the projection optical system manufactured by the manufacturing method according to the sixth embodiment can be applied to a full exposure type projection exposure apparatus.

In the projection exposure apparatus according to the seventh embodiment, at least a part of the illumination optical system 41 to 47c that illuminates the reticle R with a beam of the light source 40, in particular a portion whose optical energy is high, is an optical element made of an isometric (cubic) system crystal material (for example, fluorite) is used.

Since the optical performance required for such an illumination optical system is lower than that for a projection optical system, according to the seventh embodiment, the influence (polarization aberration) of the birefringence of the illumination optical system is not decreased (which is accomplished by optimizing azimuths of crystal axes of an isometric (cubic) system crystal material of the illumination optical system).

However, like in the sixth embodiment, when the optical performance required for the illumination optical system is high, the azimuths of crystal axes of an isometric (cubic) system crystal material may be optimized. Alternatively, the influence (polarization aberration) of birefringence due to an isometric (cubic) system crystal material may be compensated.

In addition, according to the seventh embodiment, as the light source 40, an ArF excimer laser that supplies a pulse beam having a wave length of 193 nm is used. Alternatively, as the light source 40, an $F_2$ laser that supplies a pulse beam having a wave length of 157 nm, a $Kr_2$ laser that supplies a laser beam having a wave length of 147 nm, or an $Ar_2$ laser that supplies a pulse beam having a wave length of 126 nm may be used.

When the $F_2$ laser, which supplies a pulse beam having a wave length of 157 nm, is used as the light source 40, as a light transmitting material of the illumination optical system 41 to 47c, an isometric (cubic) system crystal material such as fluorite or barium fluoride or fluorine-doped silica (modified silica) may be used.

In particular, modified silica is preferable as an optical material of the micro fly's eye lens 44 in view of easy machining and a short length of a glass path.

According to the seventh embodiment, even if a crystal material such as fluorite, which has intrinsic birefringence, is used, without substantial influence of birefringence, good optical performance can be obtained.

[Other Embodiments]

The evaluating method for the image formation performance according to the present invention can be applied to an adjusting method for a projection optical system. For example, in an adjusting method for a projection optical system disclosed in Japanese Unexamined Patent Application Publication No. 2000-47103, the above-described WA is used instead of the wave surface W to be determined.

The evaluating method for the image formation performance according to the present invention can be applied to a device designing and manufacturing system disclosed in Japanese Patent Application No. 2000-234747 (filed on August 2, 12-th year of Heisei).

The system comprises a design section for designing a projection lens, a material manufacturing section for manufacturing a glass material, a part machining and manufacturing section for machining and manufacturing a lens part, and a device assembling section for assembling a projection lens. The material manufacturing section has a material inspection device and a material inspection database server. The part machining and manufacturing section has a lens part inspection device and a part inspection database server. In the design section, assembling and design data of the projection lens is redesigned according to inspection data stored in each database server. The device assembling section assembles the projection lens according to the redesigned assembling and design data. The evaluating method according to the present invention can be applied to the designing in the design section.

According to the forgoing embodiments, a projection optical system used for an exposure apparatus is to be evaluated. However, according to the present invention, to improve the alignment accuracy of an alignment device used for an exposure apparatus, an observation optical system used for the alignment device may be evaluated.

Industrial Availability of the Invention

According to the present invention, an evaluating method for image formation performance in which the influence of a coat is accurately influenced can be implemented.

In addition, when the evaluating method is applied to a design for a coat and a design for an optical system, the influence of the coat can be properly removed. In addition, as a result, an optical system having good image formation performance can be obtained.

In addition, according to the present invention, with a crystal material such as fluorite that has intrinsic birefringence, an evaluating method for image formation performance in which the influence of birefringence is accurately reflected can be implemented.

When the evaluating method is applied to a design for an optical system, the influence of birefringence can be properly removed. As a result, an optical system having good image formation performance can be obtained.

When such an optical system is used for a projection exposure, a pattern transfer can be performed with excellent image formation performance.

What is claimed is:

1. A method for evaluating image formation performance of an optical system, the method comprising the steps of:
   obtaining a phase shift distribution in a first polarization direction of a light beam on an exit pupil surface of the optical system and a phase shift distribution in a second polarization direction of the light beam, the light beam entering an image point to be evaluated of the optical system, the second polarization direction being orthogonal to the first polarization direction; and
   obtaining an average phase shift distribution as an evaluation index, the average phase shift distribution being obtained from a sum of the phase shift distribution in the first polarization direction and the phase shift distribution in the second polarization direction.

2. The method as set forth in claim 1, further comprising the steps of:
   obtaining an average phase shift distribution of a light beam that enters a central image point of the optical system; and
   representing the average phase shift distribution obtained for the image point to be evaluated by a deviation from the average phase shift distribution obtained for the central image point so as to set the evaluation index for the central image point.

3. The method as set forth in claim 2, wherein the image formation performance is evaluated for each of a plurality of image points to be evaluated having different image heights from each other.

4. The method as set forth in claim 3, wherein a wavefront aberration of the optical system is evaluated by applying a zernike function to the evaluation index.

5. The method as set forth in claim 1, wherein the image formation performance is evaluated for each of a plurality of image points to be evaluated having different image heights from each other.

6. The method as set forth in claim 1, wherein a wavefront aberration of the optical system is evaluated by applying a zernike function to the evaluation index.

7. The method as set forth in claim 1, wherein the optical system comprises an optical element having a coat formed on its front surface.

8. A coat designing method, comprising the steps of:
   evaluating image formation performance of an optical system by the method as set forth in claim 7, the optical system comprising an optical element having a coat formed on its front surface; and
   designing a coat to be formed on the optical system according to a result of the evaluation.

9. An optical system comprising a coat designed by the coat designing method as set forth in claim 8.

10. A projection exposure apparatus for projection-exposing an image of a projection original onto a workpiece with a light beam having a predetermined wavelength, the projection original being disposed on a first surface, the workpiece being disposed on a second surface, the projection exposure apparatus comprising:
   a light source for supplying the light beam having the predetermined wavelength; an illumination optical system being disposed in an optical path between the light source and the first surface, for guiding the light beam from the light source to the projection original; and
   a projection optical system being disposed in an optical path between the first surface and the second surface, for forming the image of the projection original on the second surface, wherein the projection optical system is the optical system as set forth in claim 9.

11. A projection exposure method for projection-exposing an image of a projection original to a workpiece with a light beam having a predetermined wavelength, the projection original being disposed on a first surface, the workpiece being disposed on a second surface, the method comprising the steps of:
supplying the light beam having the predetermined wavelength;
illuminating the projection original with the light beam having the predetermined wavelength; and
causing a projection optical system to form the image of the projection original on the second surface according to the light beam from the projection original, wherein
the projection optical system is the optical system as set forth in claim 7.

12. An optical system designing method, comprising the steps of:
evaluating image formation performance of an optical system comprising an optical element having a coat formed on its front surface, on the assumption that the coat is to be an ideal coat;
evaluating image formation performance of the optical system by the method as set forth in claim 7; and
designing the optical system according to results of the two evaluations.

13. A design program for storing therein the optical system designing method as set forth in claim 12.

14. A computer readable storage medium for storing thereon the design program as set forth in claim 13.

15. A design program for storing therein the steps of:
evaluating image formation performance of an optical system by the method as set forth in claim 7, the optical system comprising an optical element having a coat formed on its front surface; and
designing a coat to be formed on the optical system according to a result of the evaluation.

16. A computer readable storage medium for storing thereon the design program as set forth in claim 15.

17. A design program for storing therein the steps of:
evaluating image formation performance of an optical system which comprises an optical element having a coat formed on its front surface, on the assumption that the coat is to be an ideal coat;
evaluating image formation performance of the optical system by the method as set forth in claim 7; and
designing the optical system according to results of the two evaluations.

18. A computer readable storage medium for storing thereon the design program as set forth in claim 17.

19. The method as set forth in claim 1, wherein
the optical system comprises an optical element having retardation.

20. An optical system designing method, comprising the steps evaluating image formation performance of an optical system by the method as set forth in claim 19, the optical system comprising an optical element having retardation; and
designing the optical system according to a result of the evaluation.

21. An optical system being designed by the optical system designing method as set forth in claim 20.

22. A design program for storing therein the optical system designing method as set forth in claim 20.

23. A computer readable storage medium for storing thereon the design program as set forth in claim 22.

24. A design program for storing therein the steps of:
evaluating image formation performance of an optical system by the method as set forth in claim 1; and
designing the optical system according to a result of the evaluation.

25. A computer readable storage medium for storing thereon the design program as set forth in claim 24.

26. A method for evaluating image formation performance of an optical system, the method comprising the steps of:
obtaining a phase shift distribution in a first polarization direction of a light beam on an exit pupil surface of the optical system and a phase shift distribution in a second polarization direction of the light beam, the light beam entering an image point to be evaluated of the optical system, the second polarization direction being orthogonal to the first polarization direction; and
obtaining a retardation distribution as an evaluation index, the retardation distribution being obtained from a difference between the phase shift distributions in the first and second polarization directions.

27. The method as set forth in claim 26, further comprising the steps of:
obtaining a retardation distribution of a light beam that enters a central image point of the optical system; and
representing the retardation distribution obtained for the image point to be evaluated by a deviation from the retardation distribution obtained for the central image point so as to set the evaluation index for the central image point.

28. The method as set forth in claim 27, wherein
the image formation performance is evaluated for each of a plurality of image points to be evaluated having different image heights.

29. The method as set forth in claim 26, wherein
the image formation performance is evaluated for each of a plurality of image points to be evaluated having different image heights.

30. The method as set forth in claim 26, wherein:
the image point to be evaluated is a central image point of the optical system; and
an RMS value of the retardation distribution and an average of the retardation distribution on the exit pupil surface are obtained as evaluation indexes.

31. The method as set forth in claim 26, wherein
the optical system comprises an optical element having a coat formed on its front surface.

32. A coat designing method, comprising the steps of:
evaluating image formation performance of an optical system by the method as set forth in claim 31, the optical system comprising an optical element having a coat formed on its front surface; and
designing a coat to be formed on the optical system according to a result of the evaluation.

33. An optical system comprising a coat designed by the coat designing method as set forth in claim 32.

34. A projection exposure apparatus for projection-exposing an image of a projection original onto a workpiece with a light beam having a predetermined wavelength, the projection original being disposed on a first surface, the workpiece being disposed on a second surface, the projection exposure apparatus comprising:
a light source for supplying the light beam having the predetermined wavelength; an illumination optical system being disposed in an optical path between the light source and the first surface, for guiding the light beam from the light source to the projection original; and a projection optical system being disposed in an optical path between the first surface and the second surface, for forming the image of the projection original on the second surface, wherein the projection optical system is the optical system as set forth in claim 33.

35. A projection exposure method for projection-exposing an image of a projection original to a workpiece with a light beam having a predetermined wavelength, the projection original being disposed on a first surface, the workpiece being disposed on a second surface, the method comprising the steps of:

supplying the light beam having the predetermined wavelength;

illuminating the projection original with the light beam having the predetermined wavelength; and causing a projection optical system to form the image of the projection original on the second surface according to the light beam from the projection original, wherein the projection optical system is the optical system as set forth in claim 33.

36. An optical system designing method; comprising the steps of:

evaluating image formation performance of an optical system comprising an optical element having a coat formed on its front surface, on the assumption that the coat is to be an ideal coat;

evaluating image formation performance of the optical system by the method as set forth in claim 31; and designing the optical system according to results of the two evaluations.

37. A design program for storing therein the optical system designing method as set forth in claim 36.

38. A computer readable storage medium for storing thereon the design program as set forth in claim 37.

39. A design program for storing therein the steps of:

evaluating image formation performance of an optical system by the method as set forth in claim 31, the optical system comprising an optical element having a coat formed on its front surface; and designing a coat to be formed on the optical system according to a result of the evaluation.

40. A computer readable storage medium for storing thereon the design program as set forth in claim 39.

41. A design program for storing therein the steps of:

evaluating image formation performance of an optical system which comprises an optical element having a coat formed on its front surface, on the assumption that the coat is to be an ideal coat;

evaluating image formation performance of the optical system by the method as set forth in claim 31; and designing the optical system according to results of the two evaluations.

42. A computer readable storage medium for storing thereon the design program as set forth in claim 41.

43. The method as set forth in claim wherein the optical system comprises an optical element having retardation.

44. An optical system designing method, comprising the steps of:

evaluating image formation performance of an optical system by the method as set forth in claim 43, the optical system comprising an optical element having retardation; and designing the optical system according to a result of the evaluation.

45. An optical system being designed by the optical system designing method as set forth in claim 44.

46. A design program for storing therein the optical system designing method as set forth in claim 44.

47. A computer readable storage medium for storing thereon the design program as set forth in claim 46.

48. A design program for storing therein the steps of:

evaluating image formation performance of an optical system by the method as set forth in claim 26; and designing the optical system according to a result of the evaluation.

49. A computer readable storage medium for storing thereon the design program as set forth in claim 48.

50. A method for evaluating image formation performance of an optical system comprising an optical element having retardation, the method comprising the steps of:

when a light beam having a first polarization direction enters an incident pupil surface of the optical system and exits from an exit pupil surface thereof, obtaining a first-1 component that is a component in the first polarization direction of the exiting light beam;

when a light beam having a second polarization direction enters the incident pupil surface of the optical system and exits from the exit pupil surface thereof, obtaining a second-2 component that is a component in the second polarization direction of the exiting light beam, the second polarization direction being orthogonal to the first polarization direction;

when the light beam having the first polarization direction enters the incident pupil surface of the optical system and exits from the exit pupil surface thereof, obtaining a first-2 component that is a component in the second polarization direction of the exiting light beam;

when the light beam having the second polarization direction enters the incident pupil surface of the optical system and exits from the exit pupil surface thereof, obtaining a second-1 component that is a component in the first polarization direction of the exiting light beam; and obtaining, as evaluation indexes, an amplitude distribution or an intensity distribution of the first-2 component of the light beam and an amplitude distribution or an intensity distribution of the second-1 component of the light beam.

51. The method as set forth in claim 50, wherein the first-1 and second-2 components of the light beam are evaluated by the evaluating method comprising the steps of:

obtaining a phase shift distribution in a first polarization direction of a light beam on an exit pupil surface of the optical system and a phase shift distribution in a second polarization direction of the light beam, the light beam entering an image point to be evaluated of the optical system, the second polarization direction being orthogonal to the first polarization direction; and obtaining an average phase shift distribution as an evaluation index, the average phase shift distribution being obtained from a sum of the phase shift distribution in the first polarization direction and the phase shift distribution in the second polarization direction.

52. The method as set forth in claim 51, wherein the evaluation indexes are extracted using a zernike function.

53. The method as set forth in claim 52, wherein:
the optical system comprises an optical element having a coat formed on its front surface; and
the first-1 component and the second-2 component are obtained with the coat taken into consideration.

54. An optical system designing method, comprising the steps of:
evaluating image formation performance of an optical system by the method as set forth in claim 53, the optical system comprising an optical element having retardation; and
designing the optical system according to a result of the evaluation.

55. The optical system designing method as set forth in claim 54, wherein
a parameter of the optical system is optimized according to the evaluation indexes.

56. The optical system designing method as set forth in claim 55, wherein
the optical system is designed such that intensities of the first-2 and second-1 components of the light beam are to be 1/100 of or smaller than intensities of the first-1 and second-2 components of the light beam.

57. An optical system being designed by the optical system designing method as set forth in claim 56.

58. A method for manufacturing an optical system, the optical system comprising an optical element having retardation, the method comprising the step of:
evaluating image formation performance of the optical system by the method as set forth in claim 57.

59. An optical system being manufactured by the optical system manufacturing method as set forth in claim 58.

60. A design program for storing therein the optical system designing method as set forth in claim 56.

61. A computer readable storage medium for storing thereon the design program as set forth in claim 60.

62. An optical system being designed by the optical system designing method as set forth in claim 54.

63. A design program for storing therein the optical system designing method as set forth in claim 54.

64. A computer readable storage medium for storing thereon the design program as set forth in claim 63.

65. The method as set forth in claim 50, wherein
the evaluation indexes are extracted using a zernike function.

66. The method as set forth in claim 50, wherein:
the optical system comprises an optical element having a coat formed on its front surface; and
the first-1 component and the second-2 component are obtained with the coat taken into consideration.

67. An optical system designing method, comprising the steps of:
evaluating image formation performance of an optical system by the method as set forth in claim 50, the optical system comprising an optical element having retardation; and
designing the optical system according to a result of the evaluation.

68. The optical system designing method as set forth in claim 67, wherein
a parameter of the optical system is optimized according to the evaluation indexes.

69. The optical system designing method as set forth in claim 68, wherein
the optical system is designed such that intensities of the first-2 and second-1 components of the light beam are to be 1/100 of or smaller than intensities of the first-1 and second-2 components of the light beam.

70. An optical system being designed by the optical system designing method as set forth in claim 69.

71. An optical system being designed by the optical system designing method as set forth in claim 67.

72. A design program for storing therein the optical system designing method as set forth in claim 67.

73. A computer readable storage medium for storing thereon the design program as set forth in claim 72.

74. A method for manufacturing an optical system, the optical system comprising an optical element having retardation, the method comprising the step of:
evaluating image formation performance of the optical system by the method as set forth in claim 50.

75. An optical system being manufactured by the optical system manufacturing method as set forth in claim 74.

76. A computer readable storage medium for storing thereon the design program as set forth in claim 75.

77. A projection exposure method for projection-exposing an image of a projection original to a workpiece with a light beam having a predetermined wavelength, the projection original being disposed on a first surface, the workpiece being disposed on a second surface, the method comprising the steps of:
supplying the light beam having the predetermined wavelength;
illuminating the projection original with the light beam having the predetermined wavelength; and
causing a projection optical system to form the image of the projection original on the second surface according to the light beam from the projection original, wherein
the projection optical system is the optical system as set forth in claim 75.

78. A design program for storing therein the steps of:
evaluating image formation performance of an optical system by the method as set forth in claim 50; and
designing the optical system according to a result of the evaluation.

79. A computer readable storage medium for storing thereon the design program as set forth in claim 78.

80. The method as set forth in claim 50, wherein
the first-1 and second-2 components of the light beam are evaluated by the evaluating method comprising the steps of:
obtaining a phase shift distribution in a first polarization direction of a light beam on an exit pupil surface of the optical system and a phase shift distribution in a second polarization direction of the light beam, the light beam entering an image point to be evaluated of the optical system, the second polarization direction being orthogonal to the first polarization direction; and
obtaining a retardation distribution as an evaluation index, the retardation distribution being obtained from a difference between the phase shift distributions in the first and second polarization directions.

* * * * *